(12) United States Patent
Yang et al.

(10) Patent No.: US 11,527,300 B2
(45) Date of Patent: Dec. 13, 2022

(54) LEVEL DEPENDENT ERROR CORRECTION CODE PROTECTION IN MULTI-LEVEL NON-VOLATILE MEMORY

(71) Applicant: Western Digital Technologies, Inc., San Jose, CA (US)

(72) Inventors: Nian Yang, Mountain View, CA (US); Sahil Sharma, San Jose, CA (US); Harish Singidi, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 1 day.

(21) Appl. No.: 17/213,486

(22) Filed: Mar. 26, 2021

(65) Prior Publication Data

US 2022/0068423 A1 Mar. 3, 2022

Related U.S. Application Data

(60) Provisional application No. 63/070,681, filed on Aug. 26, 2020.

(51) Int. Cl.

| | |
|---|---|
| *G06F 12/08* | (2016.01) |
| *G11C 29/42* | (2006.01) |
| *G11C 29/44* | (2006.01) |
| *G11C 29/24* | (2006.01) |
| *G06F 12/0882* | (2016.01) |
| *G06F 12/0811* | (2016.01) |
| *G11C 29/50* | (2006.01) |

(52) U.S. Cl.
CPC .......... *G11C 29/42* (2013.01); *G06F 12/0811* (2013.01); *G06F 12/0882* (2013.01); *G11C 29/24* (2013.01); *G11C 29/44* (2013.01); *G11C 29/50004* (2013.01); *G06F 2212/7201* (2013.01)

(58) Field of Classification Search
CPC .. G11C 29/42; G06F 12/0811; G06F 12/0882
See application file for complete search history.

(56) References Cited

U.S. PATENT DOCUMENTS

| 5,371,714 A | 12/1994 | Matsuda et al. |
| 5,488,694 A | 1/1996 | McKee et al. |
| 5,828,623 A | 10/1998 | Dilbeck |

(Continued)

OTHER PUBLICATIONS

Code rate—Wikipedia, Modified Feb. 18, 2019, [online] Available at: <<https://en.wikipedia.org/w/index.php?title=Code_rate&oldid=883894995>>, 2 pages.

(Continued)

*Primary Examiner* — Mohammed A Bashar
(74) *Attorney, Agent, or Firm* — Patterson & Sheridan, LLP; Steven H. Versteeg

(57) ABSTRACT

A method, apparatus, and system for level dependent error correction code protection in multi-level non-volatile memory. A write command to write data to a non-volatile memory array may be received. At least one multi-level page of multi-level storage cells may be determined for the write data. A coding rate for the write data of the at least one multi-level page may be determined based on an attribute of the at least one multi-level page. An ECC codeword may be generated that satisfies the coding rate and includes the write data. The ECC codeword may then be stored on the at least one multi-level page.

20 Claims, 16 Drawing Sheets

(56) References Cited

U.S. PATENT DOCUMENTS

| | | |
|---|---|---|
| 6,222,762 B1 | 4/2001 | Guterman et al. |
| 6,725,322 B1 | 4/2004 | Shiraishi et al. |
| 7,237,074 B2 | 6/2007 | Guterman et al. |
| 8,195,912 B2 | 6/2012 | Flynn et al. |
| 8,239,619 B2 | 8/2012 | Hung et al. |
| 8,261,010 B2 | 9/2012 | Eom et al. |
| 8,407,449 B1 | 3/2013 | Colon et al. |
| 8,473,690 B1 | 6/2013 | Condict |
| 8,489,854 B1 | 7/2013 | Colon et al. |
| 8,880,977 B2 | 11/2014 | Sharon et al. |
| 8,914,696 B2 | 12/2014 | Chen et al. |
| 8,935,302 B2 | 1/2015 | Flynn et al. |
| 9,015,425 B2 | 4/2015 | Flynn et al. |
| 9,021,343 B1 | 4/2015 | Hu et al. |
| 9,208,018 B1 | 12/2015 | Northcott et al. |
| 9,223,662 B2 | 12/2015 | Flynn et al. |
| 9,424,930 B2 | 8/2016 | Wood et al. |
| 9,503,125 B2 | 11/2016 | Zhang |
| 9,594,520 B2 | 3/2017 | Tomlin et al. |
| 9,645,758 B2 | 5/2017 | Peterson et al. |
| 9,766,976 B2 | 9/2017 | d'Abreu et al. |
| 10,133,663 B2 | 11/2018 | Atkisson et al. |
| 10,877,900 B1 | 12/2020 | Muthiah |
| 10,896,123 B2 * | 1/2021 | Yang .................. G06F 11/1068 |
| 2005/0270856 A1 | 12/2005 | Earhart et al. |
| 2005/0273551 A1 | 12/2005 | Keays |
| 2009/0150641 A1 | 6/2009 | Flynn et al. |
| 2010/0228912 A1 | 9/2010 | Huang et al. |
| 2010/0332729 A1 | 12/2010 | Alrod et al. |
| 2012/0239860 A1 | 9/2012 | Atkisson et al. |
| 2012/0281479 A1 | 11/2012 | Kochar et al. |
| 2013/0031429 A1 | 1/2013 | Sharon et al. |
| 2013/0229868 A1 | 9/2013 | Koh et al. |
| 2015/0074487 A1 * | 3/2015 | Patapoutian ........ G06F 11/1012 714/758 |
| 2016/0110252 A1 * | 4/2016 | Hyun .................. G06F 11/1044 714/766 |
| 2018/0307558 A1 | 10/2018 | Chen et al. |
| 2019/0155746 A1 | 5/2019 | Bhatia et al. |
| 2022/0075687 A1 | 3/2022 | Jain |

OTHER PUBLICATIONS

Die (integrated circuit)—Wikipedia, Modified Oct. 9, 2019, [online] Available at: <<https://en.wikipedia.org/wlindex.?php?title=Die_(integrated_circuit)&oldid=920444315<<, 3 pages.

Parity bit—Wikipedia, Modified May 9, 2020, [online] Available at: <<https://en.wikipedia.org/w/index.php?title=Parity_bit&oldid=955754073>>, 7 pages.

* cited by examiner

LEVEL DEPENDENT ERROR CORRECTION CODE PROTECTION IN MULTI-LEVEL NON-VOLATILE MEMORY

CROSS-REFERENCE TO RELATED APPLICATIONS

This application claims benefit of U.S. Provisional Patent Application Ser. No. 63/070,681, filed Aug. 26, 2020, which is herein incorporated by reference.

BACKGROUND

As NAND memory cell storage technologies progress from a single bit per memory cell (single level cell or "SLC") to operation with multi-level cells (MLCs), tri-level cells (TLCs), and quad-level cells (QLCs), storing two, three, and four bits of data, respectively per memory cell, the number of memory states defined within a voltage range (also referred to as a Vt window) increases exponentially. As a non-volatile memory device of memory cells is used, memory states may shift over time to higher threshold voltages or lower threshold voltages. Furthermore, the memory states may spread out widening and overlapping with adjacent memory states. These changes can lead to increased errors when reading the data from the multi-level memory cells.

In addition, using QLC memory cells may involve complicated encoding schemes for the four levels of data stored per memory cell. For example, 1-2-6-6, 1-2-4-8, 2-3-5-5, and other encoding schemes may be used, where each number refers to the number of memory state/encoding changes that occur within a memory level, i.e., how many points along that level may see a change from either a "0" to "1" or "1" to "0" memory state. Memory levels where fewer points along the level may be read to ascertain a cell's memory state may incur a lower bit error rate (BER) than levels on which more points along the level are read to properly sense and read the data for a particular level. Conversely, memory levels where more points along the level, more memory states, may be read to ascertain a cell's memory state may incur a higher bit error rate (BER) than levels on which fewer points along the level are read to properly sense and read the data for a particular level. There is, therefore, a need for solutions that may provide error correction coding for multi-level pages tailored to the BERs of one or more multi-level pages.

BRIEF SUMMARY

This disclosure relates to a method for level dependent error correction code protection in multi-level non-volatile memory. A write command to write data to a non-volatile memory array may be received. A multi-level page of multi-level storage cells may be determined for that write data. A coding rate for the write data of at least one multi-level page may be determined based on an attribute of the at least one multi-level page. An ECC codeword may be generated that satisfies the coding rate and includes the write data. The ECC codeword may then be stored on the at least one multi-level page.

This disclosure further relates to an apparatus for level dependent error correction code protection in multi-level non-volatile memory comprising an address allocator and a packetizer. The address allocator may determine the multi-level page to store data of a set of data blocks associated with a set of write commands. The packetizer may combine data of the set of data blocks into a payload for an ECC codeword, change a payload size for the payload in response to a reliability attribute of the determined multi-level page satisfying a threshold, and signal the changed payload size to an error correction code encoder configured to generate the ECC codeword.

This disclosure also relates to a system for level dependent error correction code protection in multi-level non-volatile memory comprising a non-volatile memory array and a storage controller. The non-volatile memory array may comprise Quad-level Cell (QLC) memory cells. The storage controller may comprise a flash translation layer, an error correction code encoder, and a read/write circuit. The flash translation layer may convert a logical block address (LBA) of a storage command into a physical block address (PBA) assigned to a multi-level page of QLC memory cells and associate write data of a plurality of write commands with the multi-level page. The multi-level page may be of a type selected from the group consisting of a lower multi-level page, a middle multi-level page, an upper multi-level page, and a top multi-level page. The error correction code encoder may generate ECC codewords for the write data assigned to the multi-level page and adjust an ECC strength for generated ECC codewords in response to the multi-level page comprising at least one type, one multi-level page type. The read/write circuit may store the ECC codewords on the multi-level page in response to write commands.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The solution described herein directs data to multi-level pages in a way that helps balance the bit error rate (BER) across the page levels by adjusting an error correction code coding rate per multi-level page based on an attribute of the multi-level page. This involves implementing an error correction code (ECC) encoder that manages ECC codewords having parity sections configured to use variable parity sizes.

"Bit error rate" refers to a measure of a number of bits in error of a total overall number of bits processed. Depending on the use case, a bit error rate may be calculated either before, or after, an Error Correction Code (ECC) decoder has made one or more attempts to correct one or more bits in error.

"ECC codeword" or "codeword" refers to data and corresponding error detection and/or correction information, (e.g., parity information or redundancy information). In certain embodiments the data of an ECC codeword may be referred to as a payload and the error detection and/or correction information may be referred to as parity. ECC codewords may comprise any suitable error-correcting encoding, including, but not limited to, block ECC encoding, convolutional ECC encoding, Low-Density Parity-Check (LDPC) encoding, Gallager encoding, Reed-Solomon encoding, Hamming codes, Multidimensional parity encoding, cyclic error-correcting codes, BCH codes, and/or the like.

Figure 1:
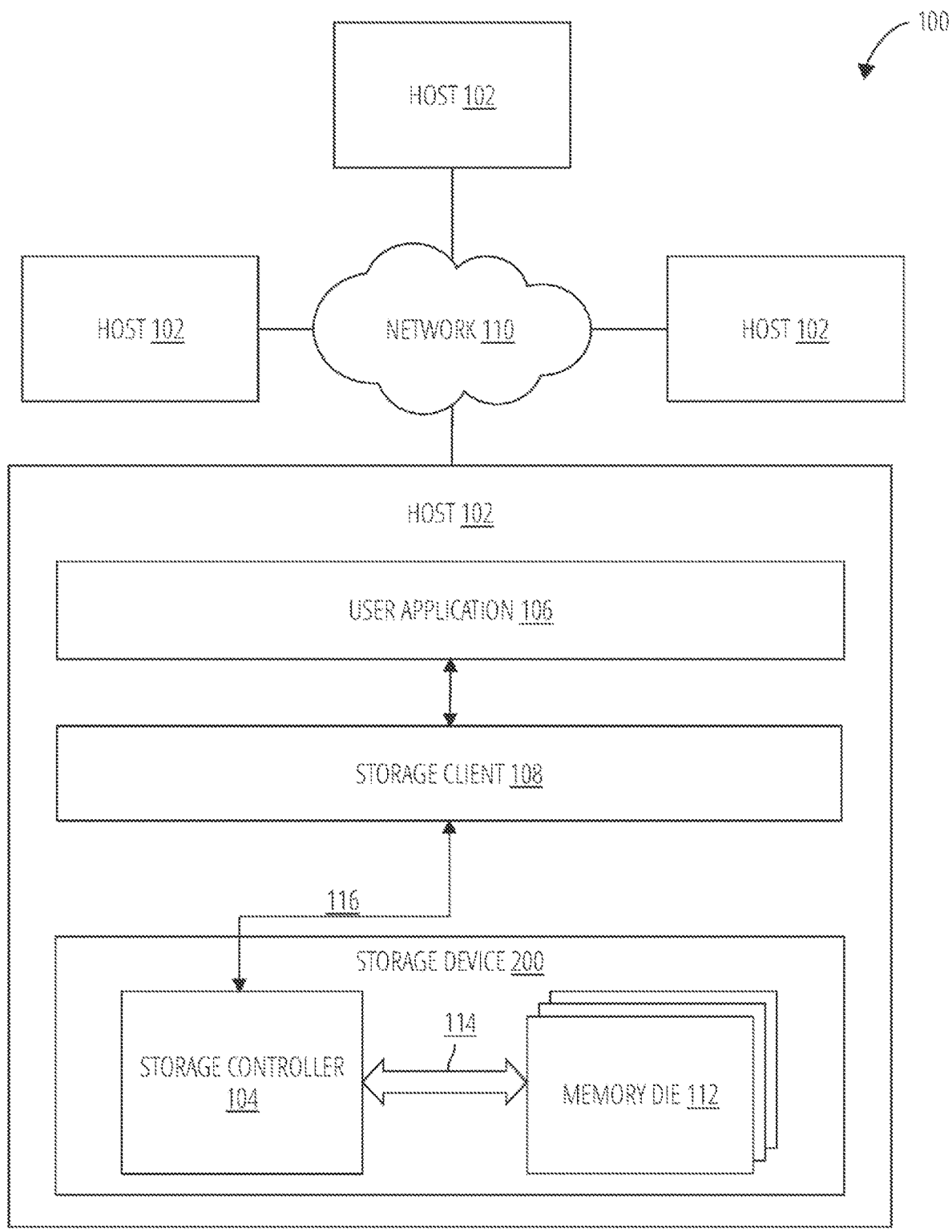
FIG. 1 illustrates a storage system 100 in accordance with one embodiment.

FIG. 1 is a schematic block diagram illustrating one embodiment of a storage system 100 that includes a storage device in accordance with the disclosed solution. The storage system 100 comprises a storage device 200, a storage controller 104, a memory die 112, at least one host 102, a user application 106, a storage client 108, a data bus 116, a bus 114, and a network 110. "Host" refers to any computing device or computer device or computer system configured to send and receive storage commands.

Examples of a host include, but are not limited to, a computer, a laptop, a mobile device, an appliance, a virtual machine, an enterprise server, a desktop, a tablet, a main frame, and the like.

"Storage command" refers to any command relating with a storage operation. Examples of storage commands include, but are not limited to, read commands, write commands, maintenance commands, configuration command, administration command, diagnostic commands, test mode commands, countermeasure command, and any other command a storage controller may receive from a host or issue to another component, device, or system.

"Read command" refers to a type of storage command that reads data from memory cells. "Write command" refers to a storage command or memory command configured to direct the recipient to write, or store, one or more data blocks on a persistent storage media, such as a hard disk drive, non-volatile memory media, or the like. A write command may include any storage command that may result in data being written to physical storage media of a storage device. The write command may include enough data to fill one or more data blocks, or the write command may include enough data to fill a portion of one or more data blocks. In one embodiment, a write command includes a starting LBA and a count indicating the number of LBAs of data to write to on the storage media.

"Logical block address" refers to a value used in a block storage device to associate each of n logical blocks available for user data storage across the storage media with a logical address. In certain block storage devices, the logical block addresses (LBAs) may range from 0 ton per volume or partition. In block storage devices, each LBA maps directly to a particular data block, and each data block maps to a particular set of physical sectors, or physical data block addresses on the physical storage media. "Physical block address" refers to address information that uniquely identifies a physical location of a data block relative to all other data blocks of a non-volatile memory array.

"User data" refers to data that a host directs a non-volatile storage device to store or record.

The storage system 100 includes at least one storage device 200, comprising a storage controller 104 and one or more memory dies 112, connected by a bus 114. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Non-volatile memory array" refers to a set of non-volatile storage cells (also referred to as memory cells or non-volatile memory cells) organized into an array structure having rows and columns. A non-volatile memory array is addressable using a row identifier and a column identifier.

In certain embodiments, the non-volatile memory array may comprise a three-dimensional memory array. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g., source) at the wafer surface and the other end (e.g., drain) on top.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein. A memory array is addressable using a row identifier and a column identifier. "Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may comprise one or more non-volatile memory elements, which may include, but are not limited to: chips, packages, planes, memory die, and the like.

Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, non-volatile memory medium, non-volatile storage medium, non-volatile storage, or the like. "Non-volatile storage media" refers to any hardware, device, component, element, or circuit configured to maintain an alterable physical characteristic used to represent a binary value of zero or one after a primary power source is removed. Non-volatile storage media may be used interchangeably herein with the term non-volatile memory media.

In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

In some embodiments, each storage device 200 may include two or more memory dies 112, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies.

The storage device 200 may be a component within a host 102 as depicted in here, and may be connected using a data bus 116, such as a peripheral component interconnect express ("PCI-e") bus, a Serial Advanced Technology Attachment ("serial ATA") bus, or the like. In another embodiment, the storage device 200 is external to the host 102 and is connected, a universal serial bus ("USB") connection, an Institute of Electrical and Electronics Engineers ("IEEE") 1394 bus ("FireWire"), or the like. In other embodiments, the storage device 200 is connected to the host 102 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging. The storage device 200 is described in further detail with regard to FIG. 2.

"Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

In a further embodiment, instead of being connected directly to the host 102 as DAS, the data storage device 200 may be connected to the host 102 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 102 and the data storage device 200.

The storage system 100 includes at least one host 102 connected to the storage device 200. Multiple hosts 102 may be used and may comprise a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 102 may be a client, and the storage device 200 may operate autonomously to service data requests sent from the host 102. In this embodiment, the host 102 and storage device 200 may be connected using a computer network, system bus, Direct Attached Storage (DAS), or other communication means suitable for connection between a computer and an autonomous storage device 200.

The depicted embodiment shows a user application 106 in communication with a storage client 108 as part of the host 102. In one embodiment, the user application 106 is a software application operating on or in conjunction with the storage client 108. "Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like.

"Software" refers to logic implemented as processor-executable instructions in a machine memory (e.g., read/write volatile memory media or non-volatile memory media).

"Hardware" refers to functional elements embodied as analog and/or digital circuitry.

"Firmware" refers to logic embodied as processor-executable instructions stored on volatile memory media and/or non-volatile memory media.

"Logic" refers to machine memory circuits, non-transitory machine readable media, and/or circuitry (deleted) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The storage client 108 manages files and data and utilizes the functions and features of the storage controller 104 and associated memory dies 112. Representative examples of storage clients include, but are not limited to, a server, a file system, an operating system, a database management system ("DBMS"), a volume manager, and the like. The storage client 108 is in communication with the storage controller 104 within the storage device 200. In some embodiments, the storage client 108 may include remote storage clients operating on hosts 102 or otherwise accessible via the network 110. Storage clients may include, but are not limited to operating systems, file systems, database applications, server applications, kernel-level processes, user-level processes, applications, and the like.

In one embodiment, the storage system 100 includes one or more clients connected to one or more hosts 102 through one or more computer networks 110. A host 102 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 110 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 110 may also include a network from the IEEE 802 family of network technologies, such Ethernet, token ring, WiFi, WiMax, and the like.

The network 110 may include servers, switches, routers, cabling, radios, and other equipment used to facilitate networking the host 102 or hosts 102 and clients. In one embodiment, the storage system 100 includes multiple hosts 102 that communicate as peers over a network 110. In another embodiment, the storage system 100 includes multiple storage devices 200 that communicate as peers over a network 110. One of skill in the art will recognize other computer networks comprising one or more computer networks and related equipment with single or redundant connection between one or more clients or other computer with one or more storage devices 200 connected to one or more hosts. In one embodiment, the storage system 100 includes two or more storage devices 200 connected through the network 110 to a remote host 102, without being directly connected to or integrated within a local host 102.

In one embodiment, the storage client 108 communicates with the storage controller 104 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably). "Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like.

Certain conventional storage devices divide the physical storage media into volumes or logical partitions (also referred to as partitions). Typically, a single data block maps to a set of sectors. Each volume or logical partition may include a plurality of sectors. In certain embodiments, a single sector may be organized into a block (also referred to as a data block).

In one example embodiment, a data block includes eight sectors and has a total size of 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage manager, such as a storage controller, storage system, storage unit, storage device, or the like.

A block storage device may associate n data blocks available for user data storage across the physical storage media with a logical block address (LBA), numbered from 0 to n. In certain block storage devices, the logical block addresses may range from 0 to n per volume or logical partition. In conventional block storage devices, a logical block address maps directly to one data block.

In some embodiments, the storage controller 104 may be configured to store data on one or more asymmetric, write-once storage media, such as solid-state storage memory cells within the memory die 112. "Write once storage media" refers to a storage media such as a storage cell that is reinitialized (e.g., erased) before new data or a change to the data is written or programmed thereon. In other words, data of a write once storage media cannot be overwritten; the write once storage media is erased before subsequently writing data to the write once storage media. "Asymmetric storage media" refers to a storage media having different latencies for different storage operations. Many types of solid-state storage media (e.g., memory dies) are asymmetric; for example, a read operation may be much faster than a write/program operation, and a write/program operation may be much faster than an erase operation (e.g., reading the storage media may be hundreds of times faster than erasing, and tens of times faster than programming the storage media).

"Read operation" refers to an operation performed on a memory cell in order to obtain, sense, detect, or determine a value for data represented by a state characteristic of the memory cell.

"Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation may cause the attribute to change to a target level with a single iteration.

The memory die 112 may be partitioned into memory divisions that can be erased as a group (e.g., erase blocks) in order to, inter alia, account for the asymmetric properties of the memory die 112 or the like. As such, modifying a single data segment in-place may involve erasing the entire erase block comprising the data, and rewriting the modified data to the erase block, along with the original, unchanged data. This may result in inefficient write amplification, which may excessively wear the memory die 112.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation). "Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

Management of a data block by a storage manager includes specifically addressing a particular data block for a read operation, write operation, or maintenance operation. "Maintenance operation" refers to an operation performed on a non-volatile storage device that is configured, designed, calibrated, or arranged to improve or extend the life of the non-volatile storage device and/or data stored thereon.

A block storage device may associate n blocks available for user data storage across the storage media with a logical address, numbered from 0 to n. In certain block storage devices, the logical addresses may range from 0 to n per volume or partition. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 108.

In one embodiment, the storage controller 104 provides a block I/O emulation layer, which serves as a block device interface, or API. In this embodiment, the storage client 108 communicates with the storage device through this block device interface. In one embodiment, the block I/O emulation layer receives commands and logical addresses from the storage client 108 in accordance with this block device interface. As a result, the block I/O emulation layer provides the storage device compatibility with a block storage client 108.

In one embodiment, a storage client 108 communicates with the storage controller 104 through a host interface comprising a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 112 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 112. "Characteristic" refers to any property, trait, quality, or attribute of an object or thing. Examples of characteristics include, but are not limited to, condition, readiness for use, unreadiness for use, size, weight, composition, feature set, and the like.

The storage controller 104 receives a logical address and a command from the storage client 108 and performs the corresponding operation in relation to the memory die 112. The storage controller 104 may support block I/O emulation, a direct interface, or both.

Figure 2:
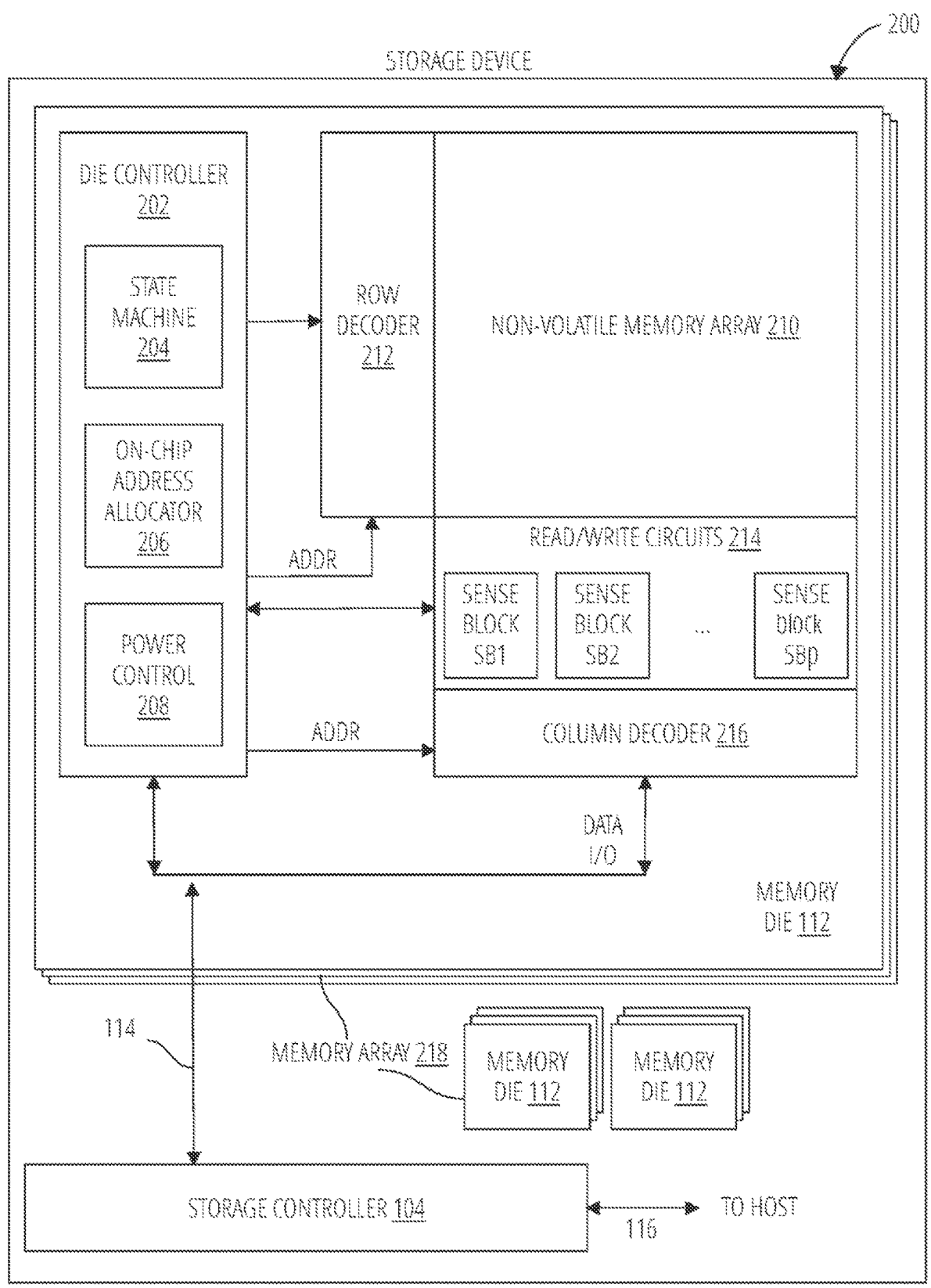
FIG. 2 illustrates a storage device 200 in accordance with one embodiment.

FIG. 2 is a block diagram of an exemplary storage device 200. "Storage device" refers to any hardware, system, subsystem, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

The storage device 200 may include a storage controller 104 and a memory array 218. Each memory die 112 in the memory array 218 may include a die controller 202, at least one non-volatile memory array 210 in the form of a three-dimensional array and read/write circuits 214.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g., source) at the wafer surface and the other end (e.g., drain) on top.

"Threshold voltage" refers to a voltage level that when applied to a gate electrode of a transistor causes the transistor to conduct a current between the drain electrode and source electrode.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The non-volatile memory array 210 is addressable by word line via a row decoder 212 and by bit line via a column decoder 216. "Bit line" refers to a circuit structure configured to deliver a voltage and/or conduct current to a column of a memory array. "Word line" refers to a structure within a memory array comprising a set of memory cells. The memory array is configured such that the operational memory cells of the word line are read or sensed during a read operation. Similarly, the memory array is configured such that the operational memory cells of the word line are read, or sensed, during a read operation. A word line may also be referred to as a physical page or page for short. A physical word line may span a single plane within a memory die. Two or more physical word lines, for example on the same row of a non-volatile memory array may form a logical word line, also referred to as a logical page.

In one embodiment, the column comprises a NAND string or memory string and may also be referred to as channel. In one embodiment, the column is referred to as a NAND string and the NAND string comprises a channel. In one embodiment, a bit line connects to a NAND string at a drain end or drain side of the NAND string. A memory array may have one bit line for each memory cell along the word lines of the memory array.

"Channel" refers to a structure within a memory array that extends from a source side to a drain side. In one embodiment, a channel is a vertical column within a memory array that forms a conductive path between a source line coupled to one end of a NAND string and a bit line coupled to another end of the NAND string. A channel may be formed from a variety of materials including, for example, polysilicon.

In one embodiment, a channel within a NAND string creates a conductive path by activating one or more memory cells (e.g., one or more selected memory cells and unselected memory cells) along the NAND string, and one or more control structures (e.g., select gates (source and/or drain) between a source line connected to one end (e.g., the source side) of the NAND string and a sense amplifier or bit line connected to the other end (e.g., the drain side) of the NAND string.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

The read/write circuits 214 include multiple sense blocks SB1, SB2, . . . , SBp (sensing circuitry) and allow a page of memory cells to be read or programmed in parallel. In certain embodiments, each memory cell across a row of the memory array together form a physical page. "Read/write circuit" refers to a device, component, element, module, system, sub-system, circuitry, logic, hardware, or circuit configured and/or operational to read data from and write data to a storage media, such as storage cells of a storage array.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 102 and storage controller 104 via a data bus 116, and between the storage controller 104 and the one or more memory dies 112 via bus 114. The storage controller 104 may comprise the logical modules described in more detail with respect to FIG. 1.

The non-volatile memory array 210 can be two-dimensional (2D—laid out in a single fabrication plane) or three-dimensional (3D—laid out in multiple fabrication planes). The non-volatile memory array 210 may comprise one or more arrays of memory cells including a 3D array. In one embodiment, the non-volatile memory array 210 may comprise a monolithic three-dimensional memory structure (3D array) in which multiple memory levels are formed above (and not in) a single substrate, such as a wafer, with no intervening substrates. The non-volatile memory array 210 may comprise any type of non-volatile memory that is monolithically formed in one or more physical levels of arrays of memory cells having an active area disposed above a silicon substrate. The non-volatile memory array 210 may be in a non-volatile solid-state drive having circuitry associated with the operation of the memory cells, whether the associated circuitry is above or within the substrate.

Word lines may comprise sections of the layers containing memory cells, disposed in layers above the substrate. Multiple word lines may be formed on single layer by means of trenches or other non-conductive isolating features.

The die controller 202 cooperates with the read/write circuits 214 to perform memory operations on memory cells of the non-volatile memory array 210, and includes a state machine 204, an address allocator 206, and a power control 208. The state machine 204 provides chip level control of memory operations.

The address allocator 206 provides an address interface between that used by the host or a storage controller 104 to the hardware address used by the row decoder 212 and column decoder 216. The power control 208 controls the power and voltages supplied to the various control lines during memory operations. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like.

"Source control line" refers to a control line configured to operate a select gate (e.g., turn the select gate on, activate, and off, deactivate) for coupling a source side of a NAND string to a source line and/or another circuit.

"Source side" refers to the end of a NAND string or side of a three-dimensional memory array connected to the source layer or line on a memory die. The term comes from the source terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line. The gate terminal of each transistor may then control whether or not current flows through the transistor from source to drain, and through the string from source line to bit line.

"Source line" refers to a structure, circuit, circuitry, and/or associated logic configured to convey an electrical current and/or voltage from a supply to one or more channels of associated NAND strings. In certain embodiments, a source line is configured to convey a voltage to, and/or discharge a voltage from multiple NAND strings concurrently. In other embodiments, a source line is configured to convey a voltage to, and/or discharge a voltage from multiple NAND strings in series.

In certain embodiments, a source control line couples to one or more source-side select gates that are between the source line and one or more NAND strings and the source control line manages whether voltage or current passes between the source line and the NAND string. In such an embodiment, the source line may also be referred to as a common source line.

"Source-side select gate" refers to a select gate functioning as a switch to electrically connect a source line to a NAND string and/or a channel of a NAND string. Examples of source lines include source-side select gates, dummy word line select gates, and the like. In certain embodiments, a source-side select gate may comprise just source-side select gates (e.g., SGS0, SGS1, etc.). In other embodiments, a source-side select gate may comprise just dummy word line select gates (e.g., DWLS0, DWLS1, etc.). In still other embodiments, a source-side select gate may comprise both source-side select gates (e.g., SGS0, SGS1, etc.) and dummy word line select gates (e.g., DWLS0, DWLS1, etc.). A select gate positioned between the source line and the NAND string on the source side of the NAND string is referred to as a source-side select gate.

"Drain control line" refers to a control line configured to operate a select gate (e.g., turn the select gate on, activate, and off, deactivate) for coupling a drain side of a NAND string to a bit line and/or a sense circuit. "Drain side" refers to the end of a NAND string or side of a three-dimensional memory array connected to the bit line(s). The term comes from the drain terminal of a field effect transistor or similar component. In a daisy-chained string of transistors, the source terminal of the first transistor may be connected to a source line, a ground or some other lower voltage line, and the drain terminal may be connected to the source terminal of the next transistor, that transistor's drain terminal may be connected to the next source terminal and so on, with the drain terminal of the final transistor connected to a higher voltage signal or power line.

The gate terminal of each transistor may then control whether or not current flows through the transistor from source to drain, and through the string from source line to bit line.

"Drain-side select gate" refers to a select gate functioning as a switch to electrically connect a bit line to a NAND string and/or a channel of a NAND string. A select gate positioned between the bit line and the NAND string on the drain side of the NAND string is referred to as a drain-side select gate.

The power control 208 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 208 may detect a sudden loss of power and take precautionary actions. The power control 208 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 210, can be thought of as at least one control circuit or storage controller which is configured to perform the techniques described herein. For example, a control circuit may include any one of, or a combination of, die controller 202, state machine 204, address allocator 206, column decoder 216, power control 208, sense blocks SB1, SB2, . . . , SBp, read/write circuits 214, storage controller 104, and so forth.

In one embodiment, the host 102 is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
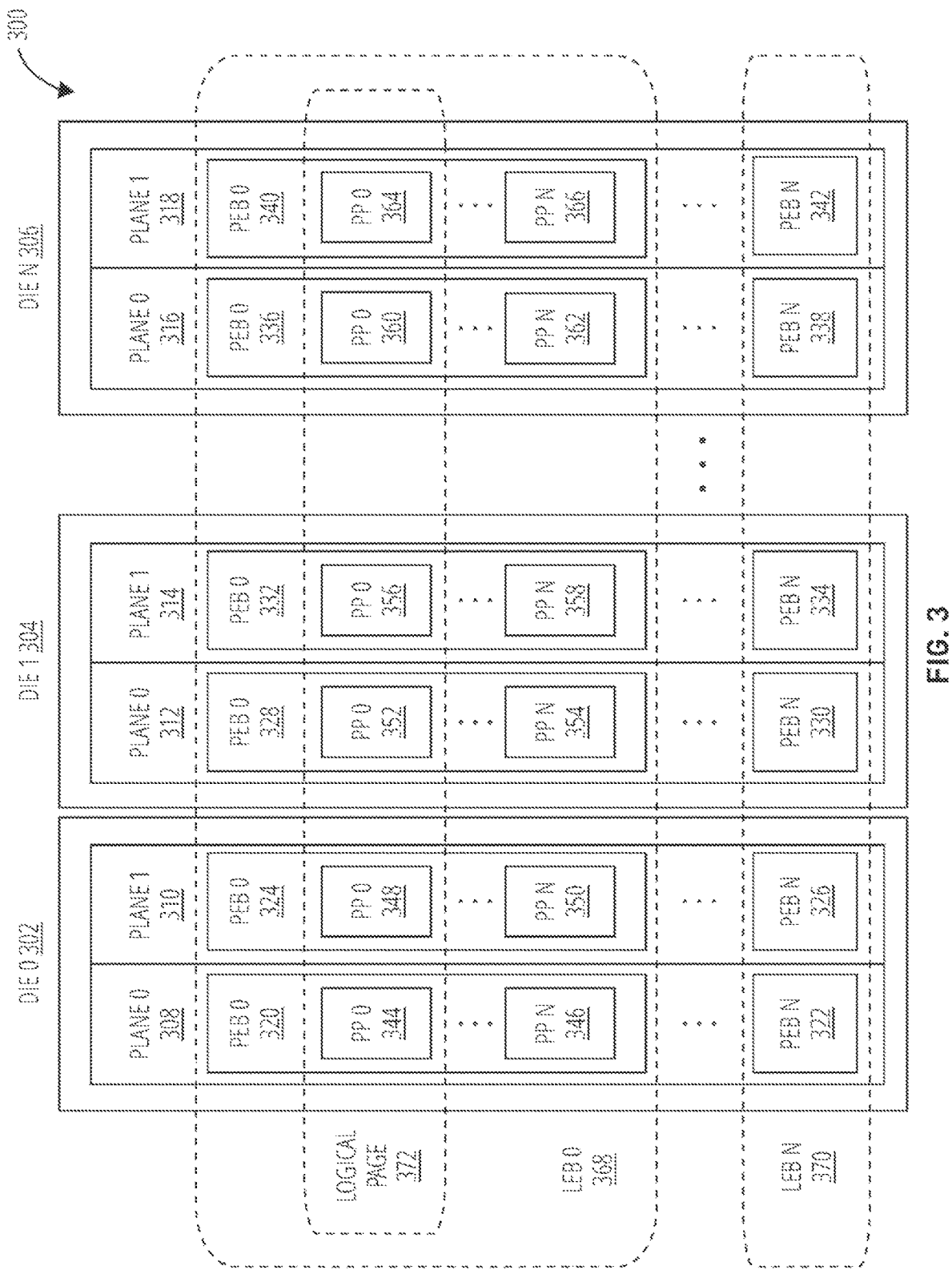
FIG. 3 illustrates a memory array 300 in accordance with one embodiment.

FIG. 3 illustrates a memory array 300 in accordance with one embodiment. The memory array 300 comprises a plurality of memory die, such as die 0 302, die 1 304, etc., through die n 306. "Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search 'die (integrated circuit)' on Wikipedia.com Oct. 9, 2019. Accessed Nov. 18, 2019.) A memory die is a die, in one embodiment, that includes a functional circuit for operating as a non-volatile memory media and/or a non-volatile memory array.

In certain embodiments, a die is divided into physical planes, such as plane 0 308 and plane 1 310 of die 0 302, plane 0 312 and plane 1 314 of die 1 304, etc., through plane 0 316 and plane 1 318 of die n 306. "Plane" refers to a division of a die that permits certain storage operations to be performed on both planes using certain physical row addresses and certain physical column addresses. More than two planes may be configured within each memory die in some embodiments. The illustration of two planes per die is not intended to limit the scope of the solution disclosed.

Each plane may be divided into physical erase blocks, as illustrated by physical erase block 0 320 through to physical erase block n 322 of plane 0 308, physical erase block 0 324 through to physical erase block n 326 of plane 1 310, physical erase block 0 328 through to physical erase block n 330 of plane 0 312, physical erase block 0 332 through to physical erase block n 334 of plane 1 314, physical erase block 0 336 through to physical erase block n 338 of plane 0 316, and physical erase block 0 340 through to physical erase block n 342 of plane 1 318. "Physical erase block" refers to smallest storage unit within a given memory die that can be erased at a given time (e.g., due to the wiring of storage cells on the memory die). The physical erase blocks may be located in separate storage dies, shown as die 0 302, die 1 304, and die n 306.

Each physical erase block can be divided into physical pages. For example, physical erase block 0 320 may include physical page 0 344 through physical page n 346, physical erase block 0 324 may include physical page 0 348 through physical page n 350, physical erase block 0 328 may include physical page 0 352 through physical page n 354, physical erase block 0 332 may include physical page 0 356 through physical page n 358, physical erase block 0 336 may include physical page 0 360 through physical page n 362, physical erase block 0 340 may include physical page 0 364 through physical page n 366.

In the illustrated embodiment, memory array 300 is further organized into logical erase blocks (LEBs, also may be referred to herein as a "metablock" or "superblock"), as shown by logical erase block0 368 and logical erase block N 370 (also referred to herein as a "metablock" or "storage block"). These LEBs include multiple physical erase blocks (PEBs) illustrated by physical erase block 0 320, physical erase block n 322, etc. The physical erase blocks may be located in separate storage dies, shown as die 0 302, die 1 304, and die n 306.

Those of skill in the art appreciate the relationship and differences between physical erase blocks and a logical erase blocks and may refer to one, or the other, or both by using the shorthand names such as erase block, block, or storage block. Those of skill in the art understand from the context of the references to an erase block whether a physical erase block or a logical erase block (or metablock or superblock) is being referred to. The concepts and techniques used in the art and those recited in the claims can be equally applied to either physical erase blocks or logical erase blocks.

"Storage block" refers to a set of storage cells organized such that storage operations can be performed on groups of storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a"block", a "memory block" or an LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein.

"Logical page" refers to a collection of physical pages that are treated as a single page for certain storage operations. "Physical page" refers to the smallest storage block within a given memory die that can be written to in a single operation. In certain non-volatile storage media, a physical page comprises a single word line on a plane of a non-volatile memory array.

A logical erase block such as logical erase block0 368 or logical erase block N 370 is further divided into multiple logical pages (logical page 372) that, in turn, may include multiple physical pages, such as physical page 0 344, physical page 0 348, physical page 0 352, physical page 0 356, physical page 0 360, and physical page 0 364, as illustrated. Physical pages may include multiple data packets, which may be grouped into error correction code codewords (ECC codewords). "Data packet" refers to a structure for organizing data. Generally, a data packet has a fixed size. In certain embodiments, a data packet may comprise one or more parts such as a header, a footer, and/or a payload. A data packet may store metadata in a header and/or footer and may store user, host, or system data in the payload. Often data organized in an original data structure is divided up or combined to form data packets, which may be sized and configured to transmission or storage of the data.

In one embodiment, a physical page represents the smallest storage unit within a given die that can be written to at a given time. In one embodiment, a physical page may comprise a single word line.

In another embodiment, a logical page is the smallest writable storage block supported by the storage controller. (In one embodiment, the storage controller may include a buffer configured to store up to a logical page worth of data; upon filling the buffer, the storage controller may write the contents of the buffer to a single logical page simultaneously.) In certain embodiments, a logical page may be referred to simply as a word line, with the understanding that the logical page includes one word line on each plane and/or memory die of the memory array 300.

In certain embodiments, the logical page spans planes within a memory die or spans planes within multiple memory die. In some instances, dividing a logical page across multiple dies may result in faster access times for a set of data when multiple dies are accessed in parallel. The logical page configurations may be mapped to any physical page on a die, or across a plurality of memory die, just as with logical erase blocks.

In some embodiments, a storage controller 104 may associate metadata, also referred to as media characteristics, with one or more of the storage blocks (logical erase blocks, physical erase blocks, logical pages, and/or physical pages). The storage controller 104 may manage metadata that identifies logical addresses for which a logical erase block stores data, as well as the respective numbers of stored data packets for each logical erase block, data block, or sector within a logical address space. A storage controller 104 may store metadata or media characteristic data in a variety of locations, including on non-volatile storage media, in volatile memory, in a structure stored with each logical erase block, or the like.

"Media characteristic" refers to an attribute or statistic for a set of particular storage cells, such as a program/erase cycle count for the set of storage cells, a read count for the set of storage cells, a retention time since a previous write for the set of storage cells (aka a data retention time), a dwell time for the set of storage cells such as a logical or physical erase block (e.g., a time between a program of an erase block and an erase of the erase block), an average of multiple previous dwell times for the set of storage cells, an error statistic for the set of storage cells, or the like.

A media characteristic for a set of storage cells may be static or may be dynamic and change over time. A media characteristic, in one embodiment, is a statistic, heuristic, mathematical model, transform, or other descriptor associated with an attribute of the non-volatile memory media.

A media characteristic, in one embodiment, includes or relates to a make, a model, a manufacturer, a product version, or the like for the storage device and/or for the non-volatile memory media. A media characteristic, in a further embodiment, may include or relate to an environmental condition or a use of the storage device and/or of the non-volatile memory media, such as a temperature, a use case (e.g., a cache use case, an archival use case, a server use case, an enterprise use case, a consumer use case, etc.), or the like.

A logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector.

In certain embodiments, the metadata comprises a cross temperature for logical erase block, an average cross temperature for open logical erase blocks of the non-volatile storage device, a temperature change rate, an average program erase count for a logical erase block, an uncorrectable bit error rate (UBER) for a logical erase block, a bit error rate, a fail bit count for a logical erase block, a charge leak rate, media characteristic, and/or the like.

Figure 4:
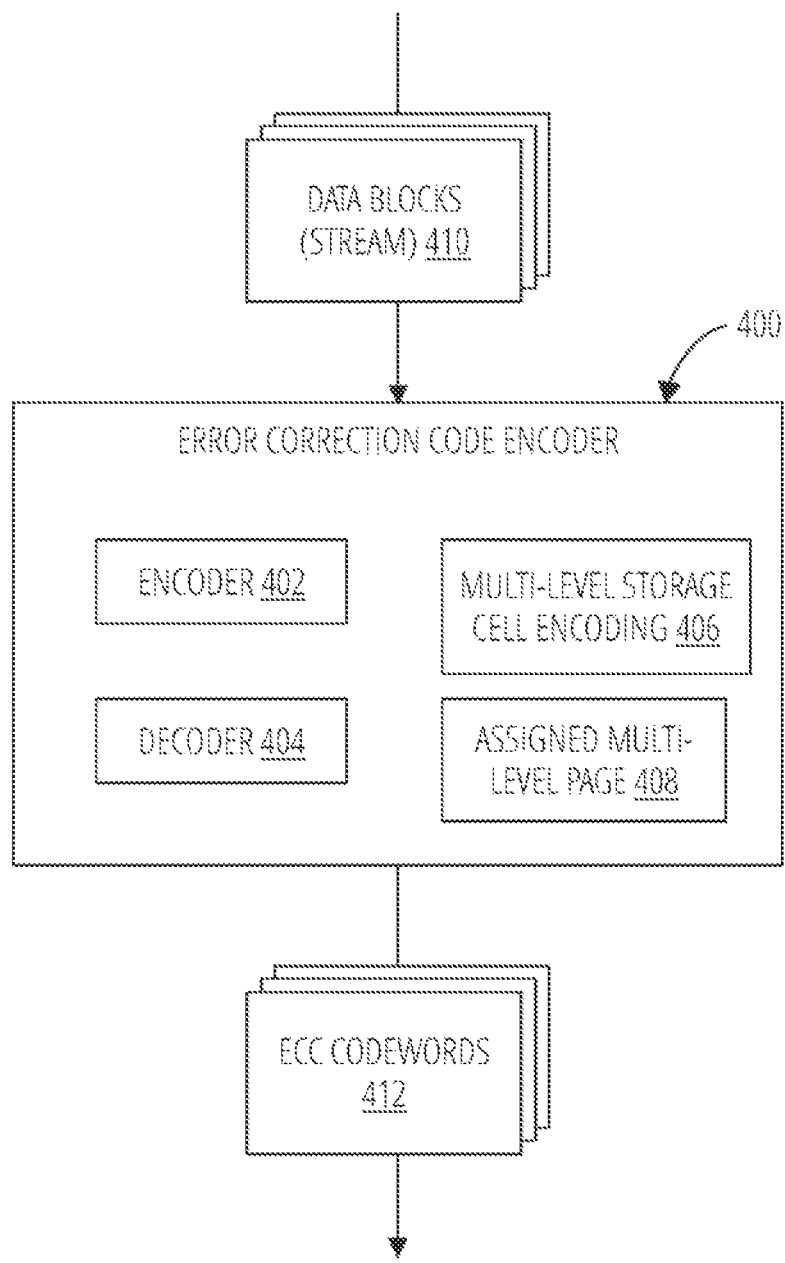
FIG. 4 illustrates an error correction code encoder 400 in accordance with one embodiment.

FIG. 4 illustrates an error correction code encoder 400 in accordance with one embodiment. The error correction code encoder 400 may comprise an encoder 402, a decoder 404, and reference a multi-level storage cell encoding 406 and an assigned multi-level page 408. The error correction code encoder 400 may accept a plurality of data blocks 410 as input and produce ECC codewords 412 as output.

"Error correction code encoder" or "ECC manager" refers to any hardware, software, firmware, circuit, component, module, logic, device, or apparatus configured, programmed, designed, arranged, or engineered to detect and/or correct errors in a data set using redundancy information (e.g., redundancy data) defined for the data set (e.g., a codeword that includes the data set and the redundancy information). The error correction code encoder, in one embodiment, may be configured to implement any suitable ECC algorithm and/or generate ECC codewords of any suitable type or length, which may include, but are not limited to, data segments and corresponding ECC syndromes, ECC symbols, ECC chunks, and/or other structured and/or unstructured ECC information. The error correction code encoder may be configured to generate ECC codewords of one or more pre-determined sizes.

The error correction code encoder may comprise one or more types of decoder(s), including, but not limited to, a low density parity check (LDPC) decoder, a Reed-Solomon code decoder, a Golay code decoder, a Bose Chaudhuri Hocquenghem (BCH) code decoder, a turbo code decoder, a multidimensional parity code decoder, a Hamming code decoder, a Hadamard code decoder, an expander code decoder, a Reed-Muller code decoder, a Viterbi decoder, a Fano decoder, or the like.

The encoder 402 is configured to encode data from one or more data blocks 410 into an ECC codeword 412 that includes a payload and a parity section. "Parity section" refers to a part of an ECC codeword. The parity section is configured to store parity data, also referred to as redundancy data. In certain embodiments, a parity section may be positioned at the end or the beginning of an ECC codeword. "Redundancy data" or "parity data" refers to a particular type of data used to enable error correction code encoders to detect and/or correct user data in a message protected by the redundancy data. In certain embodiments, redundancy data includes a copy of some or all of the message or data that represents the original message after processing.

Redundancy data may comprise parity data. Parity data refers to one or more bits associated with a string of binary code (set of ordered binary bits). Parity bits, and parity data, may be used as the simplest form of error detecting code. Parity bits, and parity data, may generally be applied to the smallest units of a communication protocol or data being exchanged, typically 8-bit octets (a byte), although parity data can also be applied separately to an entire message string of bits or set of data. (Search "parity bit" on Wikipedia.com May 9, 2020. Modified. Accessed May 20, 2020.)

The encoder 402 encodes data (e.g., the message) of the data blocks into the redundancy data such that if the data of the data blocks is corrupted, or in error, or missing, the decoder 404 can determine that the data of the data blocks is in error and which bits are in error, and may be able to correct the bits that are erroneous based on the data of the payload and the redundancy data of the parity section. The encoder 402 determines which data block, or data blocks, are used for a payload and defines the redundancy data associated with the payload such that errors in the data, generally a certain number of bit errors, are detectable and correctable using the decoder 404.

In certain embodiments, the encoder 402 is configured to adjust a size of the redundancy data stored in the parity section relative to a size of the data in the payload. Said another way, the encoder 402 may be configured to support a variable size parity section (e.g., redundancy data) and/or a variable payload size.

An error correction code encoder 400 is configured to generate redundancy data in relation to an amount of data being encoded according to a coding rate. "Coding rate" or "information rate" refers to the proportion of the data-stream that is useful (non-redundant). That is, if the code rate is k/n for every k bits of useful information, the coder/encoder generates a total of n bits, of which n-k are redundant. (Search "code rate" on Wikipedia.com Feb. 18, 2019. Modified. Accessed Jul. 28, 2020.) Another way to understand coding rate is that coding rate is a ratio (k/n) of the amount of data or information (k) included in an ECC codeword of n total bits compared to the amount of redundancy data (e.g. Parity data or Error correction code data).

In certain embodiments, the error correction code encoder 400 is configured to change a coding rate for certain ECC codewords 412 and the certain ECC codewords 412 remain the same size regardless of variations in the coding rates between ECC codewords. Where the ECC codewords retain the same size and the coding rate is changed, the changed coding rate impacts a strength of the error correction code. "ECC strength" refers to a relative measure for how capable an error correction code encoder is in detecting and recovering erroneous bits in a message that includes error correction code protection.

Furthermore, ECC strength refers to a measure of how many bits of a message an error correction code encoder is capable of detecting are in error and/or configured to correct. ECC strength may be based on the type of error correction code methods used and/or an amount of redundancy data associated with the message. Generally, the more redundancy data associated with a message, the more erroneous bits that are detectable and the more erroneous bits that are correctable.

In certain embodiments, the error correction code encoder 400 is configured to use different coding rates for encoding ECC codewords 412 based on some parameter, attribute, or media characteristic, of the data blocks or another input signal, or value, provided to the error correction code encoder 400. For example, in one embodiment, the error correction code encoder 400 is configured to use a different coding rate depending on the multi-level storage cell encoding 406 being used for one or more ECC codewords 412 and/or which multi-level page, assigned multi-level page 408, the ECC codewords 412 will be stored on. In another embodiment, the multi-level storage cell encoding 406 is predefined and the error correction code encoder 400 is configured to encode and decode ECC codewords using a particular coding rate based on the predefined multi-level storage cell encoding 406. In such an embodiment, the error correction code encoder 400 may encode and decode ECC codewords based on an assigned multi-level page 408 for the ECC codeword.

"Multi-level storage cell encoding" refers to a type of encoding scheme based on a numbering system that assigns certain bit value(s) to ranges within a range (threshold voltage (Vt) window) of threshold voltages that a memory cell may have. The bit values may be assigned such that the bit pattern satisfies a gray code encoding. The multi-level storage cell encoding permits more than one binary value to be represented across a single Vt window.

In one example, the range of threshold voltages may be one of a plurality of threshold voltage ranges that may be used to encode multiple bits of data into a storage cell (e.g., multi-level storage cell). For example, suppose a storage cell is configured to store two bits of information, and the successive ranges of threshold voltages are between a negative lower bound threshold voltage and positive upper bound threshold, e.g., about 5 volts. If four ranges are defined, the lower most range may have a binary value assignment of '00', the next highest a binary value assignment of '01', the next highest a binary value assignment of '10', and the last range a binary value assignment of '10'.

In one embodiment, the error correction code encoder 400 is configured to change a coding rate for one or more ECC codewords based on an identified or predefined multi-level storage cell encoding 406 and/or an assigned multi-level page 408 for the ECC codewords. The assigned multi-level page 408 may comprise data that identifies which multi-level page one or more ECC codewords are to be stored on, or were read from. Based on the assigned multi-level page 408, the error correction code encoder 400 may determine which coding rate to use for both encoding and decoding the data of the ECC codewords.

As described in more detail below, certain multi-level storage cell encodings 406 may impact, relate, or be associated with, certain attributes of multi-level pages and the data of the multi-level pages that is stored on a page of a non-volatile memory array. One of these attributes may be a reliability attribute based on a multi-level storage cell encoding 406 configured to define a plurality of multi-level pages. Two or more of the plurality of multi-level pages may have different reliability attributes, which may be managed by using ECC codewords having different ECC strengths (e.g., coding rates) depending on which multi-level page a particular ECC codeword is stored on.

Figure 5:
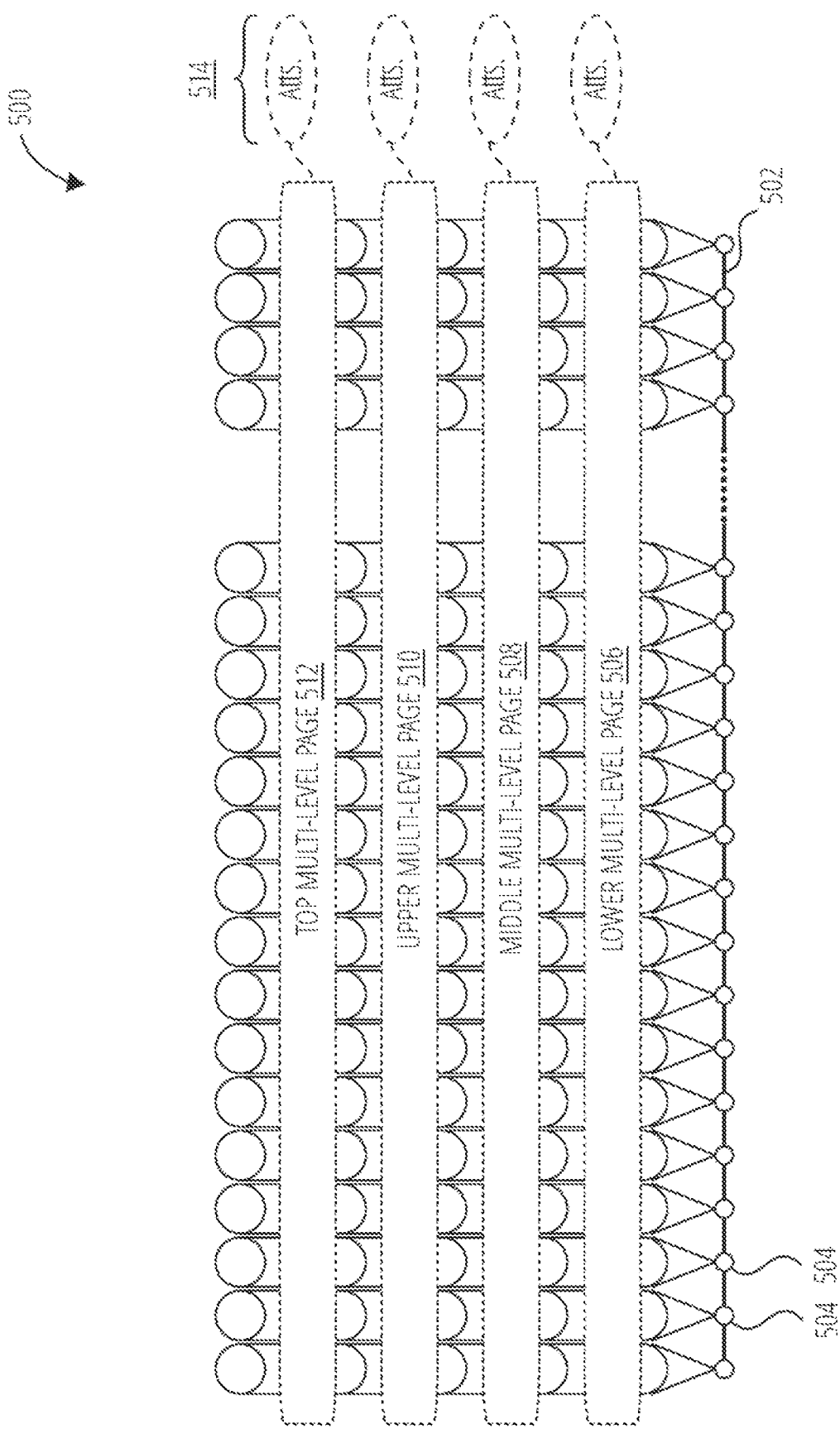
FIG. 5 illustrates a relationship of a plurality of multi-level pages 500 to a physical page in accordance with one embodiment.

FIG. 5 illustrates a model for a plurality of multi-level pages 500 in accordance with one embodiment. A non-volatile memory array may comprise many physical pages, such as physical page 502, each physical page containing numerous multi-level storage cells 504. "Page" refers to a physical page or logical page of a non-volatile storage media, such as a non-volatile memory array. In certain embodiments, the page is a set of multi-level storage cells of the non-volatile storage media. In one embodiment, a page may comprise a word line of a non-volatile memory array. Whether the page refers to a physical page or a logical page depends a context for how the term is used.

"Multi-level storage cell" refers to a storage cell configured to store two or more binary bits that each represents a distinct data value. Multi-level storage cell may be abbreviated using the term "MLC." In certain embodiments, an MLC stores two binary bits. In another embodiment, MLC may refer to storage cells that store three, four, five, or more binary bits.

In still other embodiments, other terms may be used to distinguish one set of MLC storage cells from another. In such embodiments, MLC storage cells may refer specifically to storage cells storing two-binary bits per storage cell, per industry convention. In such embodiments, storage cells that store three binary bits per storage cell may be identified as three-level cell storage cells, or TLC, for three or Tertiary levels. Storage cells that store four binary bits per storage cell may be identified as four-level cell storage cells, or QLC, for four or Quad levels. Storage cells that store five binary bits per storage cell may be identified as five-level cell storage cells, or PLC, for five or Penta levels. A similar naming convention may be used for storage cells that store six or more binary bits per storage cell.

A set of multi-level storage cells may be organized into a physical page of a non-volatile memory array. In such a configuration of multi-level storage cells, a single physical page of multi-level storage cells may be understood and considered to include N multi-level pages, where N equals the number of bits being stored in each multi-level storage cell of the single physical page. "Multi-level page" refers to a set of storage cells along a single physical page or single logical page of a non-volatile memory array wherein each storage cell is configured as a multi-level storage cell and is configured to store the same number of bits per storage cell. A physical multi-level page is a set of storage cells along a single physical page. A logical multi-level page is a set of storage cells along a single logical page.

In certain embodiments, the multi-level storage cells of the single page (logical or physical) may be configured to store a plurality of multi-level pages based on how the multiple bits of data are encoded to be represented by the multi-level storage cells. In one embodiment, the encoding used to define multi-level pages may define a predefined number of read levels to be sensed, or read, in order to decode the data bits stored in a specific multi-level page.

The plurality of multi-level pages 500 may comprise a number of multi-level pages created through, and/or based on, the encoding and configuration used for the physical page 502. In one embodiment, a physical page 502 implementing multi-level storage cells 504 such as QLC memory cells configured to store four logical pages of data as illustrated. "QLC memory cell" refers to a multi-level storage cell configured to store four bits of data. These logical pages are referred to herein as multi-level pages. Furthermore, based on the model illustrated in FIG. 5, multi-level pages may be named based on their position within the model. For example, a particular multi-level page may comprise a lower multi-level page 506, a middle multi-level page 508, an upper multi-level page 510, or a top multi-level page 512. Of course, in other embodiments, multi-level pages of a plurality of multi-level pages implemented for a page of a non-volatile memory array may use different names, be organized in a different order, and still implement concepts recited in the claims of this disclosure.

"Lower multi-level page" refers to a multi-level page configured within a multi-level page model of a plurality of multi-level pages such that lower multi-level page is the lowest multi-level page of the plurality of multi-level pages. "Middle multi-level page" refers to a multi-level page configured within a multi-level page model of a plurality of multi-level pages such that middle multi-level page is between a lowest multi-level page and a top multi-level page of the plurality of multi-level pages.

"Upper multi-level page" refers to a multi-level page configured within a multi-level page model of a plurality of multi-level pages such that upper multi-level page is between a top multi-level page and a middle multi-level page of the plurality of multi-level pages. "Top multi-level page" refers to a multi-level page configured within a multi-level page model of a plurality of multi-level pages such that top multi-level page is a highest multi-level page of the plurality of multi-level pages. "Multi-level page model" refers to a logical model for how a set of multi-level storage cells may be organized to store a plurality of multi-level pages. In the multi-level page model, each multi-level page may a predefined location or position in a stack or set of layers of multi-level pages.

The naming and location of multi-level pages depends on the number of levels being used to store data. For example, in a multi-level page model for three level cells (TLC) storage cells, the multi-level page model may have lower multi-level page on a first layer, a middle multi-level page on a next layer, and top multi-level page on the third and final layer. Similarly, a multi-level page model for four level cells (QLC) storage cells, the multi-level page model may have lower multi-level page on a first layer, a middle multi-level page on a next layer, an upper multi-level page on a next layer, and top multi-level page on the fourth and final layer.

The model of FIG. 5 also illustrates a set of attributes 514 that may be associated with each multi-level page. The attributes may be defined explicitly or may be an inherent result of how a plurality of multi-level pages are encoded/defined. "Attribute" refers to any property, trait, aspect, quality, data value, setting, or feature of an object or thing. Certain attributes may be specific to a particular multi-level page or type of multi-level page. Other attributes may apply to each multi-level page but at different degrees or levels. Still other attributes may relate to a set of multi-level pages. The value and settings for certain attributes 514 may depend on the multi-level storage cell encoding used for the plurality of multi-level pages. In certain embodiments, the set of attributes 514 is different for each multi-level page. In other embodiments, the one or more attributes of a set of attributes 514 may be common for two or more multi-level pages.

Figure 6:
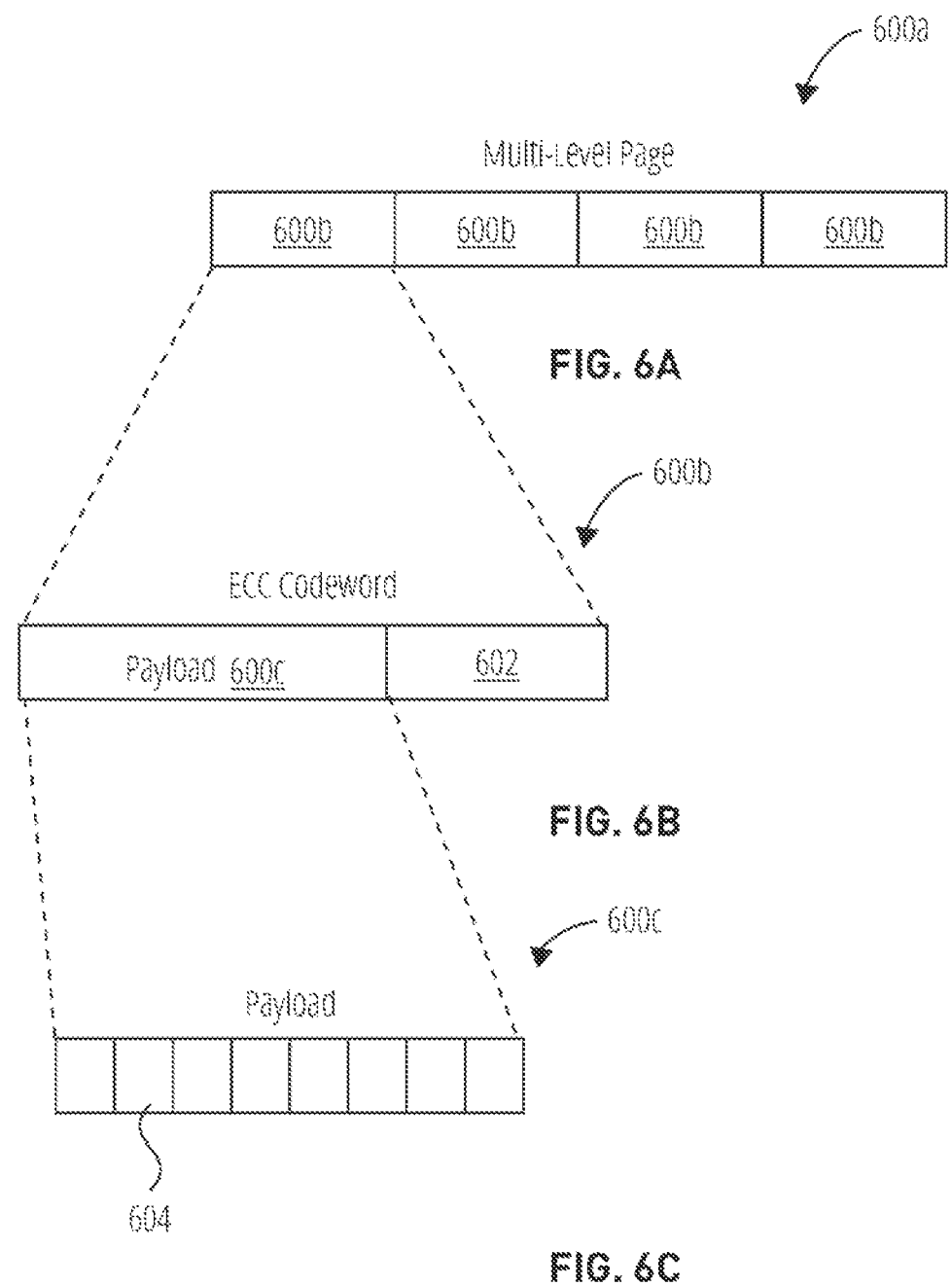
FIG. 6A illustrates a multi-level page 600*a* in accordance with one embodiment.
FIG. 6B illustrates an ECC codeword 600*b* in accordance with one embodiment.
FIG. 6C illustrates a payload 600*c* in accordance with one embodiment.

FIG. 6A illustrates a multi-level page 600a in accordance with one embodiment. The multi-level page 600a may comprise a number of ECC codewords 600b. In one embodiment, an ECC codeword is the smallest data structure that a storage controller reads or writes from a non-volatile storage media. The storage controller may read or write data in structures larger than and in units of a number of ECC codewords such that data read or written to the non-volatile storage media includes suitable redundancy data to recover erroneous bits in the data.

FIG. 6B illustrates an ECC codeword 600b in accordance with one embodiment. The ECC codeword 600b may comprise a payload 600c and a parity section 602. "Payload" refers to a part of an ECC codeword that holds a message or message data that is being protected by redundancy data associated with the ECC codeword. Generally, a payload or payload section is the largest part of an ECC codeword. The parity section 602 stores redundancy data associated with data of the payload section.

FIG. 6C illustrates a payload 600c in accordance with one embodiment. The payload 600c may comprise multiple data sectors 604. "Data sector" refers to a data structure used to manage data of a particular size and/or format. In certain embodiments, a data sector may comprise 512 bytes and eight data sectors may form a data block. The data structures of FIGS. 6A, 6B, and 6C may have different sizes or configurations in other embodiments.

Figure 7:
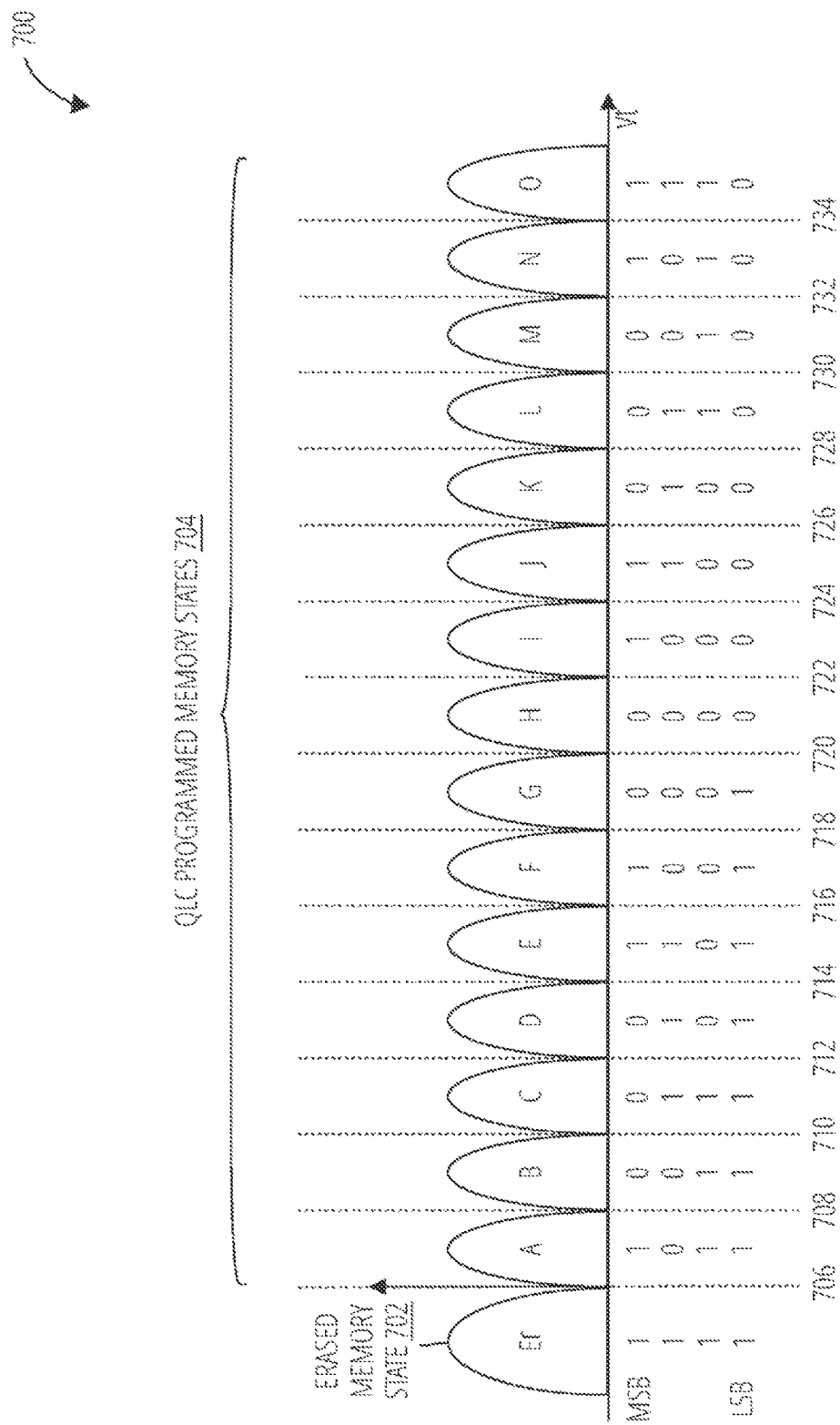
FIG. 7 illustrates memory state encoding 700 in relation to one embodiment.

FIG. 7 shows a graph of a cell threshold voltage distribution for memory cells of a non-volatile storage media and memory state encoding 700 for storage cells such as multi-level NAND flash storage cells, or the like. The memory states, in the depicted embodiment, may be encoded using a gray code encoding model, with binary values for adjacent memory states differing by a single bit in the encoding.

"Memory state" refers to a condition, attribute, and/or characteristic, of a memory cell, or storage cell, designed and/or configured to represent an encoding for one or more data bit values. In certain embodiments, the memory state may be changed by way of a storage operation. In a non-volatile memory cell, the memory cell maintains its memory state without a power source.

In certain embodiments, and in certain contexts, memory state may also refer to a collection, or set of memory cells, that collectively have a similar condition, attribute, and/or characteristic. In relation to non-volatile memory cells, groups, collections, or sets of memory cells with a similar condition within a certain range may be referred to collectively as memory cells of a particular memory state. Furthermore, reference may be made to a memory state as a shorthand reference to all memory cells having a condition that falls within a predefined range defined for that memory state.

For example, with NAND memory cells, a threshold voltage (Vt) window may be defined between a negative threshold voltage, or approximately zero threshold voltage, and a maximum threshold voltage. Within this Vt window, a number of sub-ranges may be defined and referred to as memory states. In certain embodiments, the whole Vt window may be divided up such that each threshold voltage falls within one of the memory states. In one embodiment, each memory state has a lower boundary and an upper boundary and may be represented by a cell threshold voltage distribution.

"Threshold voltage (Vt) window" refers to a range of threshold voltages defined between a negative threshold voltage, or approximately zero threshold voltage, and a maximum threshold voltage. Within this Vt window, a number of sub-ranges may be defined and referred to as memory states. In certain embodiments, the whole Vt window may be divided up such that each threshold voltage falls within one of the memory states. In one embodiment, each memory state has a lower boundary and an upper boundary that each comprise a read level. Storage cells with a threshold voltage below the read level are in a lower threshold voltage memory state and storage cells with a threshold voltage above the read level are in a higher threshold voltage memory state.

In FIG. 7, the Vt window may begin at the low end of the erased memory state 702 ("Er") on the left hand side and extend to the upper end/boundary of the "O" memory state on the right hand side. The graph includes erased memory state 702 and memory states "A"-"O" for a total of 16 memory states to represent 4 bits stored in each memory cell. Certain memory states are adjacent memory states. "Adjacent memory state" refers to a memory state that neighbors a given memory state along a range of threshold voltages with no memory states defined between the given memory state and the adjacent memory state. "Er" memory state (erased memory state 702) and "A" memory state are adjacent memory states. Similarly, "A" memory state and "B" memory state are adjacent memory states. "A" memory state and "C" memory state are not adjacent memory states because "B" memory state is between them.

The graph illustrates a threshold voltage for memory cells of a non-volatile storage media along the x-axis. The y-axis identifies a number, or count, of memory cells sensed/detected/read that have the corresponding threshold voltage along the x-axis. The curves within each memory state represent a normal distribution of memory cells that fall within a given memory state. Taken together the curves of the graph illustrate a cell threshold voltage distribution. In certain embodiments, a curve representing memory cells within a particular memory state may also be referred to as a cell threshold voltage distribution. Thus, a cell threshold voltage distribution for non-volatile storage media may include a number of cell threshold voltage distributions.

"Cell threshold voltage distribution" refers to a process or method for determining a threshold voltage for each memory cell in a set of memory cells. Cell threshold voltage distribution may be referred to as cell voltage distribution and may be referred to using the acronym "CVD."

A cell threshold voltage distribution may be determined during research and development of non-volatile memory technology to understand how memory cells behave under different conditions. In certain embodiments, a cell threshold voltage distribution may be performed during operation of non-volatile memory to determine whether the read levels being used to read a memory cell are adequate. If a bit error rate for a first set of read levels is inadequate, countermeasures may be taken to reduce the bit error rate.

In certain embodiment, these countermeasures may include adjusting configuration parameters such that a bit error rate decreases. In certain embodiments, the steps of determining a cell threshold voltage distribution, checking read levels and other media characteristics with respect to bit error rate, and taking any countermeasures, may be referred to as a CVD scan, a read scan, or a read scan operation. A CVD scan may involve significant time to complete due to the various steps involved and the number of memory cells being scanned. In particular, where memory cells store four or more bits per memory cell, a CVD scan may incur high latency, unless aspects of the claimed solution are used.

"Configuration parameter" refers to a parameter of a set of storage cells that is modifiable by way of an interface, such as a read threshold, a write or program threshold, an erase threshold, or the like. An interface for modifying a configuration parameter may include a programmable data register, a command interface of a control bus for the non-volatile memory array, an API of a device driver of the storage device, a control parameter for the storage controller, or the like.

The threshold voltage for each memory cell may be encoded to represent binary data. In particular, the threshold voltage for each memory cell may be encoded to represent a 2, 3, 4 or more bits per memory cell. For example in FIG. 7, the binary value "1111" may in one embodiment be associated with the lowest memory state (labeled Er, an erased memory state 702), the value "1011" associated with the next lowest read voltage state and first of the QLC programmed memory states 704 (labeled A), the value "0011" associated with the next highest read voltage state (labeled B), and the value "0111" associated with the next highest read voltage state (labeled C), and so on, with one bit changing between memory states, also referred to as read voltage states.

In FIG. 7, the lowest memory state Er is depicted as a negative threshold voltage below the depicted 0.0V. In other embodiments, the lowest memory state Er may comprise a positive threshold voltage above the 0.0V level or span the 0.0V level. Values, magnitudes, sizes, and the like of read voltages may vary by manufacturer and type of non-volatile memory cell, each of which are encompassed by this disclosure. A read level is used by the die controller to distinguish memory cells in one memory state from those in another.

"Read level" refers to a voltage level configured to test, check, read, or sense, which memory cells conduct at the voltage level. In certain embodiments, the memory cells may comprise transistors and the read level, or read voltage, is a voltage level at, or above a threshold voltage for the memory cells which causes the memory cell to conduct a current, to activate or enter a saturated state.

In certain embodiments, depending on the type of encoding used to store data on the memory cell and the number of bits encoded on each memory cell, a single read/sense operation using a single read voltage may be determinative of the memory state of the memory cell. In other embodiments, a number of read/sense operations each performed at different read voltage levels may be used to determine the memory state of the memory cell.

The determined memory state may then be decoded into a representation of the data bits stored by the memory cell. "Read voltage" is a shorthand reference to a "read threshold voltage." "Read level" is another term commonly used to describe a "read voltage" and the two terms are used interchangeably herein.

"Read level window" refers to a set of candidate read levels that may serve as a read level between two adjacent memory states. In certain embodiments, where the memory cells that are read a read using one or more threshold voltages, a read level window may comprise a set of threshold voltages between a low threshold voltage and a high threshold voltage, with each member of the set of candidate read levels within the read level window comprising a distinct threshold voltage.

In another embodiment comprise NAND memory cells, a read level window may comprise a set of threshold voltages between a low threshold voltage and a high threshold voltage, with each member of the set of candidate read levels within the read level window comprising a threshold voltage offset by one or more offset amounts from a default read level, such as a current read level. The offsets from the default read level may be both greater than and/or less than the default read level. A read level window may also be referred to as a "scanning" window.

Reading memory cells based on a read level may be used for reading stored data in the memory cells as well as testing/checking performance of the memory cells and determining whether to make any changes to configuration parameters for the memory cells.

FIG. 7 illustrates multiple default read levels which may be set at the time a storage device 200 is manufactured and may be tuned during a manufacturing process and/or later when the storage device 200 is in use by a customer. When memory cells are programmed, the threshold voltages are changed from the erased memory state 702 to one of the QLC programmed memory states 704. Each memory state is bounded by a default read level. If a programmed, operational, memory cell does not activate at a default read level, the threshold voltage of the memory cell is above the default read level. The read or sense storage operation is an iterative process. And completing the iterative process, either for reading data or for sensing all memory cells, such as with CVD, identifies each memory cell as a member of one of the erased memory state 702 or QLC programmed memory states 704.

Read level A 706, read level B 708, read level C 710, read level D 712, read level E 714, read level F 716, read level G 718, read level H 720, read level I 722, read level J 724, read level K 726, read level L 728, read level M 730, read level N 732, and read level O 734 in the depicted embodiment, may comprise default read levels that separate memory states A from Er, B from A, C from B, etc., respectively. While default read levels may be set at the time of manufacture, they may be adjusted, as needed to ensure proper performance of the memory cells. In certain embodiments, a default read level represents a current read level for a memory cell. "Current read level" refers to a read level that is a value that is presently being used by a die controller or storage controller for read operations on memory cells. In certain embodiments, a current read level may be a default read level that has been used for prior read operations. In another embodiment, the current read level may comprise a read level set by a prior read scan operation and which may be changed in a presently executing read scan operation.

A program storage operation changes a media characteristic, e.g., threshold voltage, of the memory cells to a different state to represent a programmed condition. By setting the media characteristic to one of a plurality of different states according to a particular encoding, multiple bits may be stored in a single memory cell. With NAND memory cells, the program operation changes the threshold voltage to a threshold voltage between two read levels. For example, in one embodiment, a program operation may program certain memory cells to an H memory state by changing the threshold voltage to a level between read level H 720 and read level I 722. In certain embodiments, additional thresholds may be used, including a programming level, a program verify level, and the like.

Figure 8:
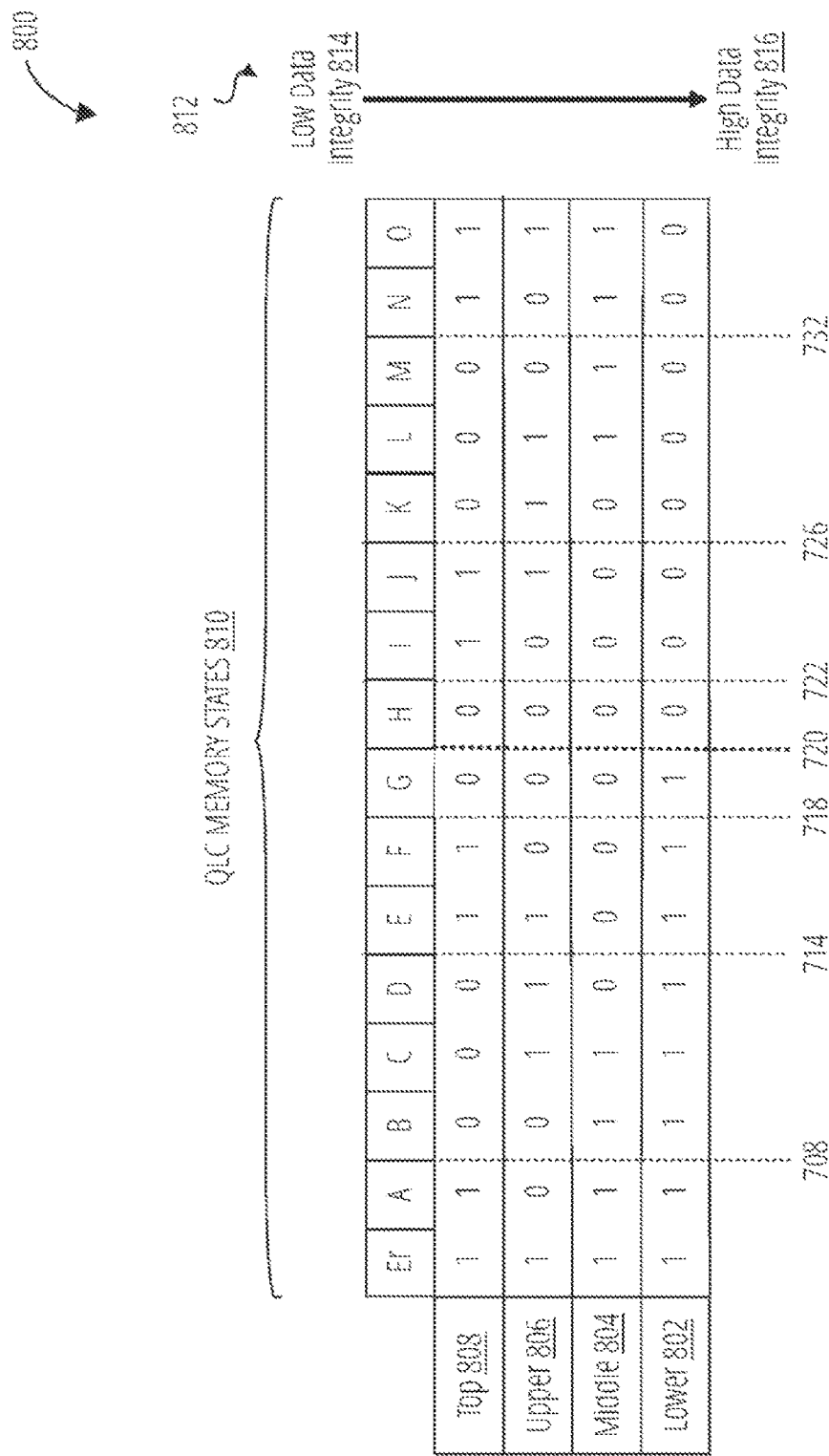
FIG. 8 illustrates an example multi-level storage cell encoding 800 in accordance with one embodiment.

Based on a data encoding, a non-volatile memory storage controller may interpret discrete threshold voltages for a quad-level storage cell as representing four binary bits. FIG. 7 and FIG. 8 illustrate an embodiment that uses a Gray code encoding. Other programming and encoding models may be used, and certain non-volatile memory media may have more or fewer possible states, allowing other amounts of data to be stored in a single storage cell. The memory states A through O may or may not be contiguous; for example, in certain embodiments, the voltage levels may be separated by band gaps known as guard bands. For example, A and B may be separated by 0.3V.

In one embodiment, the non-volatile memory array employing memory state encoding 700 may comprise NAND memory cells, and the multi-level storage cell encoding may be configured to divide up a threshold voltage (Vt) window into a plurality of memory states such as the erased memory state 702 and QLC programmed memory states 704, and assign a binary encoding to each memory state. "Binary encoding" refers to a sequence of bits or a certain length and configured to represent a state, condition, or media characteristic of something. As an example, a binary encoding may be used to represent one of n memory states that a multi-level storage cell may have at a given time. In such an embodiment, each bit of the binary encoding may represent a binary value for data at a level associated with the particular bit. The binary encoding may be configured such that each bit in the binary encoding represents a binary value on each multi-level page of a plurality of multi-level pages. "Binary value" refers to a data value in a binary number system having a value of either '0' or '1.' The binary encoding is assigned according to a gray code encoding.

FIG. 7 illustrates an example multi-level storage cell encoding that includes binary encodings assigned to each memory state. For state A, the binary encoding is '1011' which means that when a memory cell is in memory state A, the top multi-level page stores a '1' data value (the most significant bit (MSB) in the binary encoding), the upper multi-level page stores a '0' data value, the middle multi-level page stores a '1' data value, and the lower multi-level page stores a '1' data value (the least significant bit (LSB) in the binary encoding). For state B, the binary encoding is '0011' which means that when a memory cell is in memory state B, the top multi-level page stores a '0' data value (the most significant bit (MSB) in the binary encoding), the upper multi-level page stores a '0' data value, the middle multi-level page stores a '1' data value, and the lower multi-level page stores a '1' data value (the least significant bit (LSB) in the binary encoding). This same pattern can be used to interpret the data stored on each multi-level page for storage cells in memory states C-O.

"Gray code encoding" refers to a type of encoding scheme based on a numbering system that assigns certain bit value (s) to a range of threshold voltages that a memory cell may have. The bit values are assigned such that the bit pattern differs between adjacent threshold voltage ranges by one bit. Such a bit pattern assignment is advantageous because while a threshold voltage may change, drift, from one range (or memory state) to a neighboring range (or memory state), unintended changes or drift is likely not enough to cause a two bit changes in the encoding. In this manner, undesired drift can be detected and accommodated.

In one example, the range of threshold voltages may be one of a plurality of threshold voltage ranges that may be used to encode multiple bits of data into a memory cell. For example, suppose a memory cell is configured to store two bits of information, and the successive ranges of threshold voltages are between a negative lower bound threshold voltage and positive upper bound threshold, e.g., about 5 volts. If four ranges are defined, the lower most range may have a bit assignment of '00', the next highest a bit assignment of '01', the next highest a bit assignment of '10', and the last range a bit assignment of '10'.

Memory cells that store multiple bits of data may use a gray code encoding or another encoding process, such as those described in US patents: U.S. Pat. No. 6,222,762 and/or U.S. Pat. No. 7,237,074 which are included herein by reference, for all purposes.

FIG. 8 illustrates example multi-level storage cell encoding 800. The example multi-level storage cell encoding 800 may be implemented using a memory structure having lower multi-level page 802, middle multi-level page 804, upper multi-level page 806, and top multi-level page 808 multi-level pages, as introduced in FIG. 5. The memory structure may be encoded in a number of configurations assigning binary values to the QLC memory states 810. The example multi-level storage cell encoding 800 illustrates how the binary encodings can be mapped to the multi-level pages. In the illustrated example multi-level storage cell encoding 800, the example multi-level storage cell encoding 800 implements a gray code encoding method.

The specific relationship between the data programmed into the memory cells and the threshold voltage levels of the memory cell depends on the data encoding scheme used for programming the memory cells. In one example, a gray code encoding scheme may be used to assign data values to the threshold voltage distribution curves.

FIG. 7 illustrates how one example of a gray code encoding maps to the memory states. Below each memory state is a binary value of 4 bits listed from the most significant bit (MSB) reading down to the least significant bit (LSB). FIG. 8 illustrates the same encoding mapping in a table form. A multi-level page of data is associated with each position in the binary value. In other words, reading all MSB bits of memory cells along a physical word line, a physical page, or groups of physical pages along a row of the non-volatile memory array may forms a multi-level page, in one embodiment.

Using a gray code encoding enables a multi-level page to be read with fewer read operations because the gray code encoding is configured to ensure that one bit changes between adjacent memory states, and binary encodings, when reading/sensing for a particular multi-level page. For example, the erased state Er may be represented by "1111" and may transition to memory state A to represent "1011", in which the bit that changed is the neighboring bit to the MSB. FIG. 8 illustrates four pages: lower multi-level page 802, middle multi-level page 804, upper multi-level page 806, and top multi-level page 808. Each multi-level page may be read one at a time. For example, lower multi-level page 802 may be read, then middle multi-level page 804, etc., and four page reads may thus be needed to determine which of the QLC memory states 810 is represented at a particular memory cell.

Due to the gray code encoding, bits stored in a cell may be determined by reading at the locations where bits change between memory states. These locations are referred to herein as memory state transitions. "Memory state transition" refers to a level, state, attribute, or threshold of a storage cell that indicates a change in memory state from a first memory state where the level is at, or below, a threshold to a second memory state in which the level is at, or above, the threshold. In certain embodiments, the memory state transition comprises a read level.

Advantageously, using a gray code encoding enables a multi-level page to be read by reading at a minimal number of read levels, also referred to herein as memory state transitions for a multi-level page. For example to read top multi-level page 808, read operations at read level B 708, read level E 714, read level G 718, read level I 722, read level K 726, and read level N 732 are a sufficient number of reads to decode the data values for top multi-level page 808 without reading at each default read level (read level A 706—read level O 734). Thus, reading the top multi-level page 808 takes six read operations, uses six memory state transitions.

In contrast to read lower multi-level page 802, a single read operation at read level H 720 (between memory states G and H) is a sufficient number of reads to decode the data values for lower multi-level page 802. No other reads are needed because the binary value is the same for memory states Er-G (e.g., '1') and for memory states H-O (e.g., '0'). Because the lower multi-level page 802 includes only one memory state transition, one read level, the lower multi-level page may be faster to sense/read. The lower multi-level page 802 may also inherently have a lower BER than multi-level pages with more than one read level/memory state transition.

In one embodiment, a multi-level storage cell encoding may determine how the binary encodings are done and thereby how many read levels or memory state transitions each multi-level page has. In one embodiment, as illustrated, a multi-level storage cell encoding may define one memory state transition for a lower multi-level page 802 (between memory states G and H), two memory state transitions for a middle multi-level page 804 (between memory states C-D and K-L), six memory state transitions for an upper multi-level page 806 (between Er-A, B-C, E-F, I-J, L-M, and N-O), and six memory state transitions for a top multi-level page 808 (at read level B 708, read level E 714, read level G 718, read level I 722, read level K 726, and read level N 732, as shown). This configuration may be summarized by reference to the number of read levels or memory state transitions moving from the lower multi-level page to the top multi-level page. For example, the illustrated multi-level storage cell encoding is a '1-2-6-6' coding scheme.

FIG. 8 also identifies an attribute of a plurality of multi-level pages organized according to the illustrated model. In particular, in view of the multi-level storage cell encoding, certain multi-level pages may have a different data integrity than others. FIG. 8 illustrates a range 812 that shows that, with the example multi-level storage cell encoding 800, a top multi-level page 808 has low data integrity 814 and that the data integrity varies along a continuum to high data integrity 816 for the lower multi-level page 802. Advantageously, the claimed solutions use this difference to make data storage more efficient in data storage devices.

As indicated earlier, an example multi-level storage cell encoding 800 may have a BER imbalance between the top multi-level page 808 and the lower multi-level page 802. Embodiments of the disclosed solutions adjust the coding rates for ECC codewords stored on different multi-level pages such that more data may be stored on multi-level pages having high data integrity 816 while using lower ECC strength and less data is stored on multi-level pages having low data integrity 814 while using higher ECC strength.

The disclosed solutions provide a more even BER between the multi-level pages. While a lower multi-level page 802 may store more data, more data is at risk of being in error, however, this higher risk of bit errors may be counter-balanced by high data integrity 816 that results in part because of the example multi-level storage cell encoding 800. Specifically, a multi-level page having a fewest number of read levels and/or memory state transitions may have the highest data integrity among a set of multi-level pages stored on a single page. The embodiments disclosed herein may leverage this attribute to store more data on one multi-level page and even out BERs among multi-level pages.

Having even BERs may be desirable because then the performance of a storage device 200 may be more uniform and predictable and consistently meets the users expectations. In certain embodiments, having more data on a lower multi-level page may be advantageous for reading data since only a lower multi-level page may be read. Reading a lower multi-level page having high data integrity 816 results in fewer bit errors which means a storage controller can return the read results faster. In addition, a lower multi-level page in accordance with example multi-level storage cell encoding 800 may be read faster since an error correction code encoder may have a smaller set of redundancy data to process. In addition, a lower multi-level page in accordance with example multi-level storage cell encoding 800 may be read faster since there is only one read level, one read operation, required to determine the binary values for memory cells on the lower multi-level page. Having a single read level means the sensing of the memory cells is completed in one low level read/sense operation and a single set of data is transferred between a memory die and the storage controller. If a multi-level page requires reading more than one read level, there is a low level read operation for each read level and a transfer operation for reach low level read operation.

Figure 9:
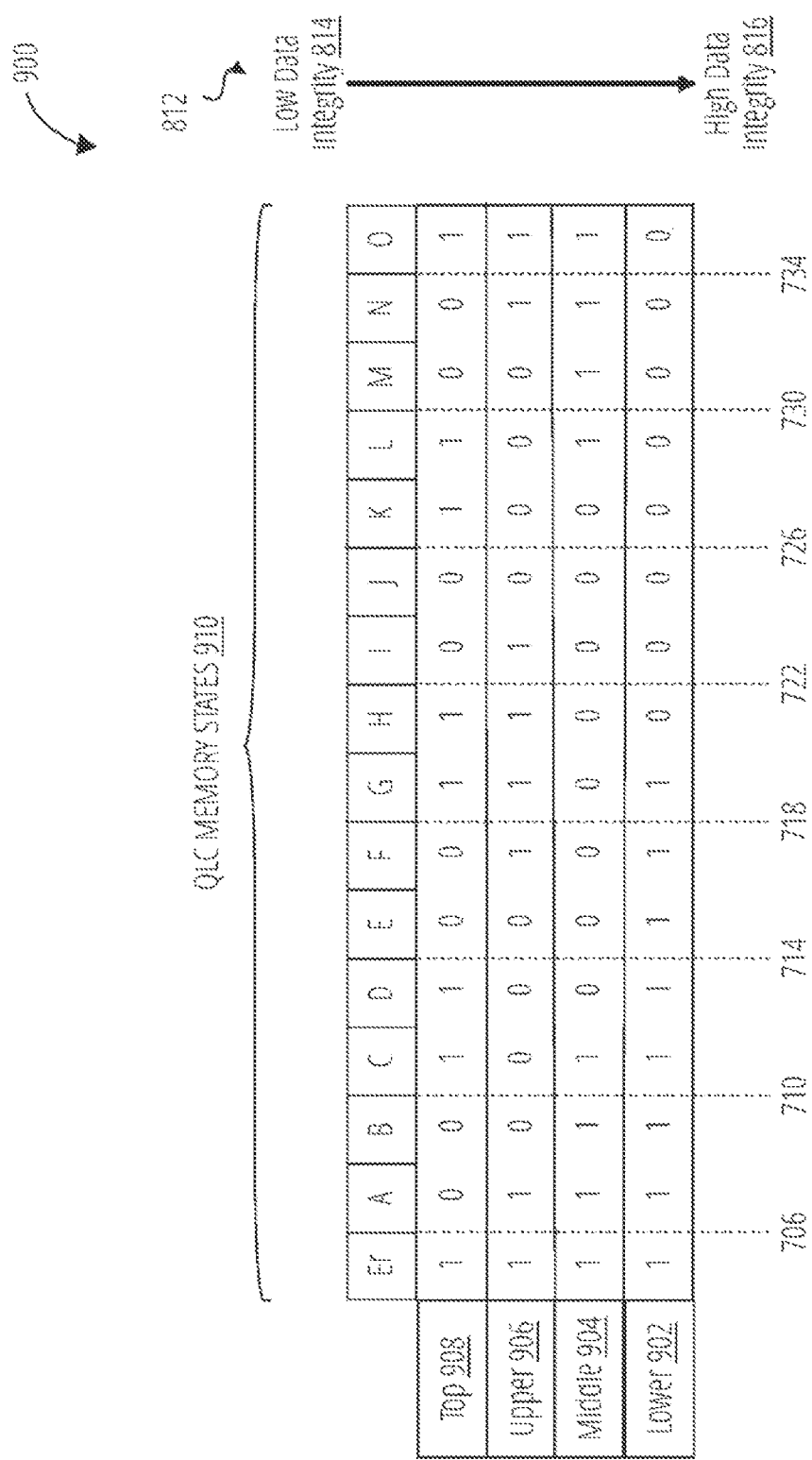
FIG. 9 illustrates an example multi-level storage cell encoding 900 in accordance with one embodiment.

FIG. 9 illustrates example multi-level storage cell encoding 900. The example multi-level storage cell encoding 900 may be implemented using a memory structure having lower multi-level page 902, middle multi-level page 904, upper multi-level page 906, and top multi-level page 908 multi-level pages, as introduced in FIG. 5. The binary encodings comprise different binary values for the QLC memory states 910.

In one embodiment, as illustrated, multi-level storage cell encoding may define one memory state transition for a lower multi-level page 902 (between memory states G and H), two memory state transitions for a middle multi-level page 904 (between memory states C-D and K-L), four memory state transitions for an upper multi-level page 906 (between A-B, E-F, I-J, and M-N), and eight memory state transitions for a top multi-level page 908 (at read level A 706, read level C 710, read level E 714, read level G 718, read level I 722, read level K 726, read level M 730, and read level O 734) as shown. This configuration may be referred to as a "1-2-4-8" coding scheme.

Figure 10:
FIG. 10 illustrates an example multi-level storage cell encoding 1000 in accordance with one embodiment.

FIG. 10 illustrates example multi-level storage cell encoding 1000. The example multi-level storage cell encoding 1000 may be implemented using a memory structure having lower multi-level page 1002, middle multi-level page 1004, upper multi-level page 1006, and top multi-level page 1008 multi-level pages, as introduced in FIG. 5. The binary encodings comprise different binary values for the QLC memory states 1010.

In one embodiment, as illustrated, multi-level storage cell encoding may define two memory state transitions for a lower multi-level page 1002 (between memory states C-D and K-L), three memory state transitions for a middle multi-level page 1004 (between memory states E-F, G-H, and I-J), five memory state transitions for an upper multi-level page 1006 (between A-B, F-G, J-K, L-M, and N-O), and five memory state transitions for a top multi-level page 1008 (at read level A 706, read level C 710, read level E 714, read level I 722, and read level N 732) as shown. This configuration may be referred to as a "2-3-5-5" coding scheme. Numerous additional coding schemes may be used to encode data upon multi-level pages. Those illustrated in FIG. 8 through FIG. 10 may experience an imbalanced BER because of the different number of memory state transitions implemented on each page level, as compared to a '4-3-4-4' coding scheme or other more balanced scheme.

Figure 11:
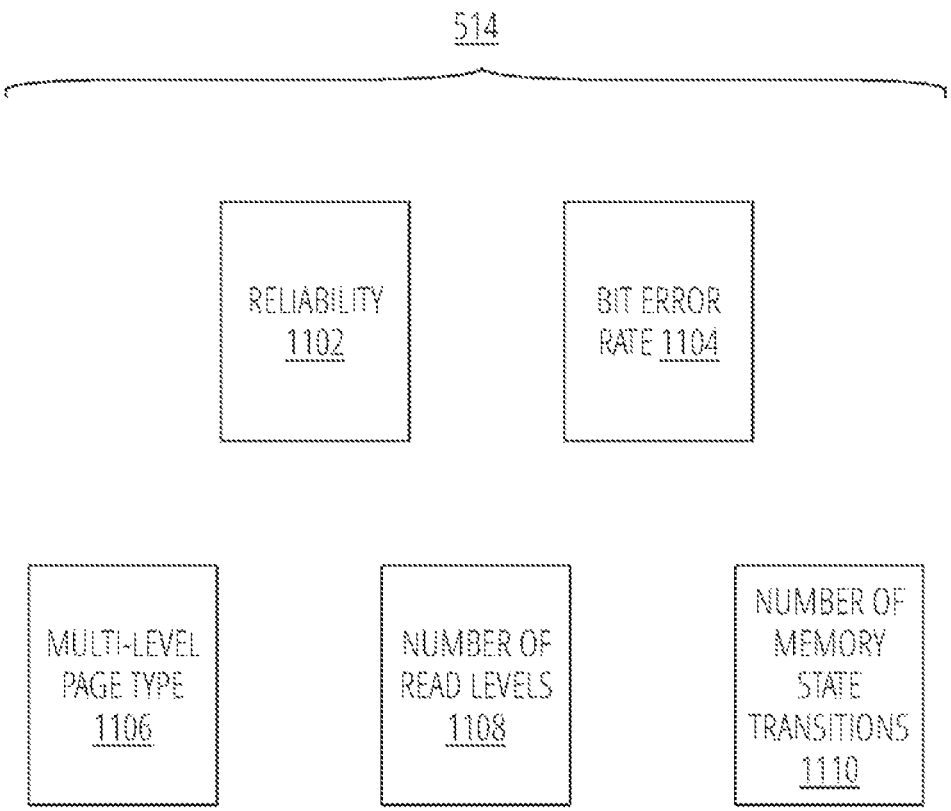
FIG. 11 illustrates different attributes in accordance with certain embodiments.

FIG. 11 illustrates different examples of attributes 514 that multi-level pages may have. The attributes 514 may include a reliability attribute 1102, a bit error rate attribute 1104, a multi-level page type attribute 1106, a number of read levels attribute 1108, and a number of memory state transitions attribute 1110.

The reliability attribute 1102 may in some embodiments be used to indicate a multi-level page having known reliability issues, or to have been implemented in a more reliable type of memory structure. "Reliability attribute" refers to is an attribute that identify how reliable the thing associated with the reliability attribute is. A reliability attribute may comprise a single value or percentage. Alternatively, a reliability attribute may comprise a value in relation to a scale, such as a numeric scale from 1-10 in which a lower number represents less reliability and a higher number represents more reliability. "Reliability" refers to a state, quality, trait, or condition of an object, thing, device, or system to perform, function, or operate, within an expected range, level, or set of specifications over a number of iterations. Various factors may impact, or define a reliability attribute 1102. For example, the multi-level storage cell encoding used for a page may result in one multi-level page being more reliable than another multi-level page. This difference in reliability may define the reliability attribute. In one embodiment, a reliability attribute 1102 may be represented as a value or percentage in relation to a range. For example, a reliability attribute 1102 may comprise a value between 0 and 100 represented as a percentage.

The bit error rate attribute 1104 may comprise a value or setting directly connected to a bit error rate. The bit error rate attribute 1104 may represent a particular value or rate relative to a total number of bits. For example, a bit error rate may be a value between 0 and n where n is the number of bits in an ECC codeword. In certain embodiments, the bit error rate attribute 1104 may be predefined and based on research and development testing done when developing a storage device 200. In certain embodiments, the bit error rate attribute 1104 may comprise a media characteristic defined when a storage device 200 is placed into service and which may be periodically updated.

In certain embodiments, the media characteristics and attributes for a multi-level page may be inherent and/or generally fixed such that the type of multi-level page, as defined in the model described in relation to FIG. 5 is sufficient for gaining the benefits and advantages of the claimed embodiments. Accordingly, the multi-level page type attribute 1106 may comprise any identifier or indicator that identifies a type of multi-level page. In embodiments that use QLC memory cells, a multi-level page type attribute 1106 may identify the multi-level page as being of a type such as a lower multi-level page, a middle multi-level page, an upper multi-level page, and a top multi-level page.

A number of read levels attribute 1108 may indicate a number of read levels defined for the multi-level page by a multi-level storage cell encoding. For example, in multi-level pages encoded with a '2-3-5-5' gray code encoding, such as is illustrated in FIG. 10, the lower multi-level page 1002 may have a number of read levels attribute 1108 with a value of "2" while the top multi-level page 1008 has a number of read levels attribute 1108 of "5." A number of memory state transitions attribute 1110 may indicate a number of memory state transitions defined for the multi-level page by a multi-level storage cell encoding. Read level H 720 is one example of a memory state transition and the corresponding attribute for the lower multi-level page would be a value of '1.'

In certain embodiments, an attribute 514 for a multi-level page may relate to a specific aspect of a multi-level storage cell encoding used. For example, if a multi-level page has a single read level, for example of the attribute 514 comprises a number of read levels attribute 1108 equal to one. Such a multi-level page may store ECC codewords configured such that the coding rate for the ECC codewords leverages this single read level attribute. In another example, a multi-level page may have the attribute 514 that the multi-level page has a BER that is lower than other multi-level pages by a certain threshold. In this example, such a multi-level page may store ECC codewords configured such that the coding rate for the ECC codewords leverages the lower BER, for example by using a coding rate that has a lower ECC strength.

Figure 12:
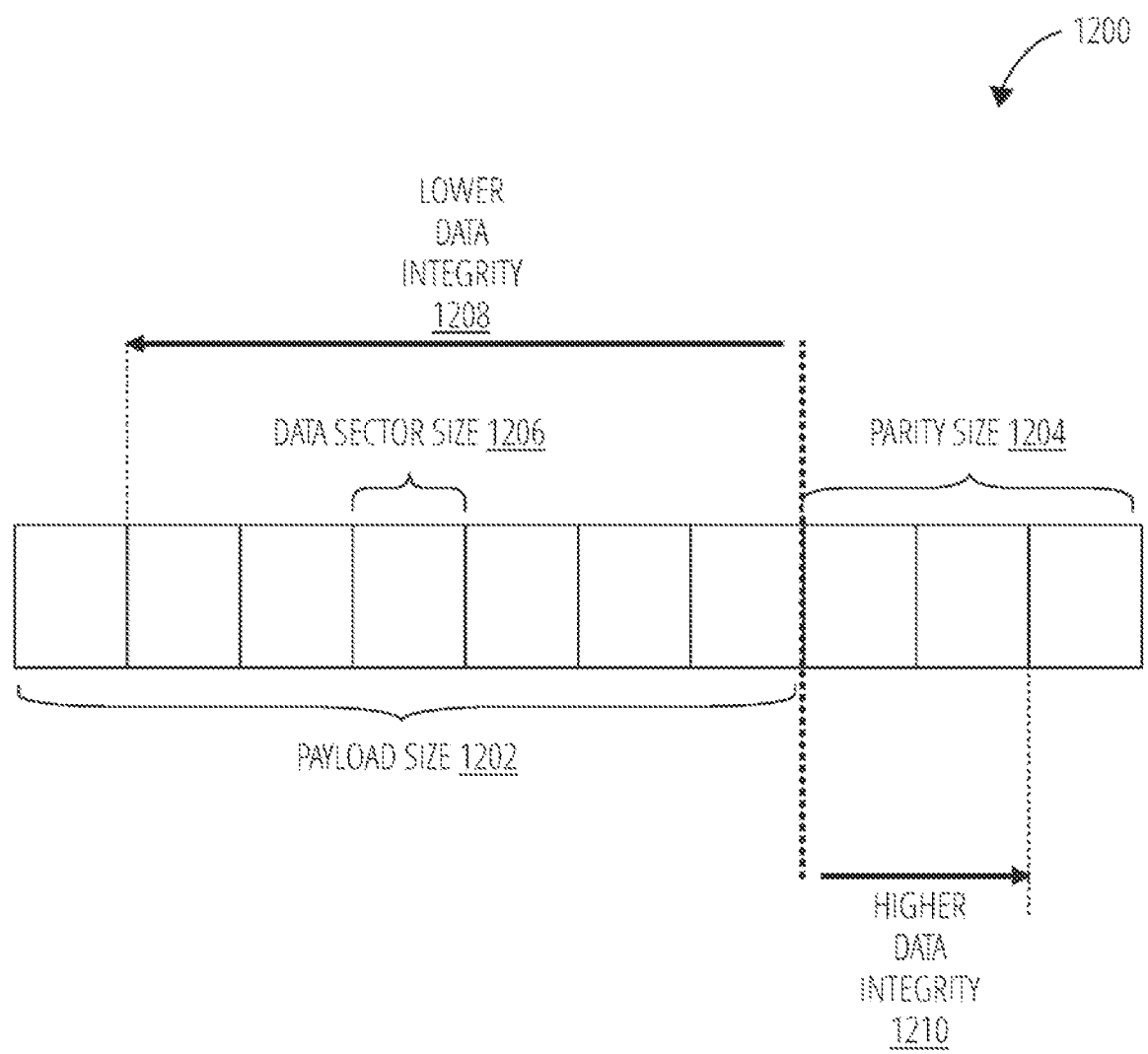
FIG. 12 illustrates an ECC codeword 1200 in accordance with one embodiment.

FIG. 12 illustrates an ECC codeword 1200 and a dynamic or variable size of components of the ECC codeword in accordance with one embodiment. The ECC codeword 1200 may comprise a payload and a parity section as introduced in FIG. 6A through FIG. 6C. The payload size 1202 and parity size 1204 of the ECC codeword 1200 may vary as indicated by the dotted lines. "Payload size" refers to a size measured in data storage units for a payload of an ECC codeword. In one embodiment, a data storage unit is equal in size to a data sector. "Parity size" refers to a size measured in bits or bytes, or some other data storage measurement unit, for a parity section. The unit of measure for a parity size may depend on the ECC method being used to encode and decode the ECC codewords.

The data sector size 1206 of the sectors that make up the payload and parity sections may remain fixed, and the payload size 1202 and parity size 1204 may vary by whole number increments of the data sector size 1206. For an ECC codeword 1200 indicated as having lower data integrity 1208, the parity size 1204 may be increase. For an ECC codeword 1200 indicated as having higher data integrity 1210, the payload size 1202 may be increase. As illustrated, if the payload size 1202 increases, then the parity size 1204 decreases by a proportional amount. Similarly, if the payload size 1202 decreases, then the parity size 1204 increases by a proportional amount. In certain embodiments, even though the payload size 1202 and parity size 1204 may change in size, the overall size of the ECC codeword remains the same.

The parity size 1204 may change proportionate to the payload size 1202 such that the size of the ECC codeword 1200 remains the same. That is, the number of data sectors comprising the ECC codeword 1200 and the data sector size 1206 may remain constant.

In certain embodiments, the payload size 1202 and parity size 1204 may be adjusted based on a data integrity attribute for a particular non-volatile storage media, storage cell, set of storage cells or the like. "Data integrity" refers to an attribute or measure of data, or a data sample, indicating whether the data is accurate, not erroneous, and unchanged from a prior transmission or recording of the data. In certain embodiments, data integrity is an objective characteristic. In other embodiments, data integrity may be expressed in relation to a spectrum in which one end represents no, or very low data integrity and the opposite end represents perfect, or very high data integrity.

In certain embodiments, the coding rate for an ECC codeword may be changed to reflect a different data integrity for a non-volatile storage media and/or data transmission media. In certain embodiments, a multi-level page and/or an attribute of a multi-level page may provide an indication of the data integrity for data stored on that multi-level page such that a coding rate can be determined that differs from a default coding rate.

For example, where the error correction code encoder supports ECC codewords of variable coding rates, certain embodiments may determine a coding rate based on attributes of a multi-level page. In certain embodiments, a packetizer or error correction code encoder may determine the coding rate for an ECC codeword.

Determining the coding rate may comprise increasing the payload size 1202 in response to an attribute indicating a greater data integrity for data stored on the multi-level page that is assigned to the ECC codeword 1200. In particular, the payload size 1202 may be increased, and the parity size 1204 decreased, based on the data integrity of the ECC codeword 1200 being higher in relation to other multi-level pages that will be stored on the same multi-level storage cells. Alternatively, or in addition, the payload size 1202 may be decreased, and the parity size 1204 increased, based on the data integrity of the ECC codeword 1200 being lower in relation to other multi-level pages that will be stored on the same multi-level storage cells.

In certain embodiments, the relationship between data integrity among different multi-level pages on the same multi-level storage cells may be represented by a reliability attribute. In such an embodiment, an error correction code encoder or packetizer may determine the coding rate for an ECC codeword by increasing a coding rate for the at least one multi-level page in response to the at least one multi-level page having a greater reliability attribute than other multi-level pages. Or an error correction code encoder or packetizer may determine the coding rate for an ECC codeword by decreasing a coding rate for the at least one multi-level page in response to the at least one multi-level page having a lower reliability attribute than other multi-level pages.

Figure 13:
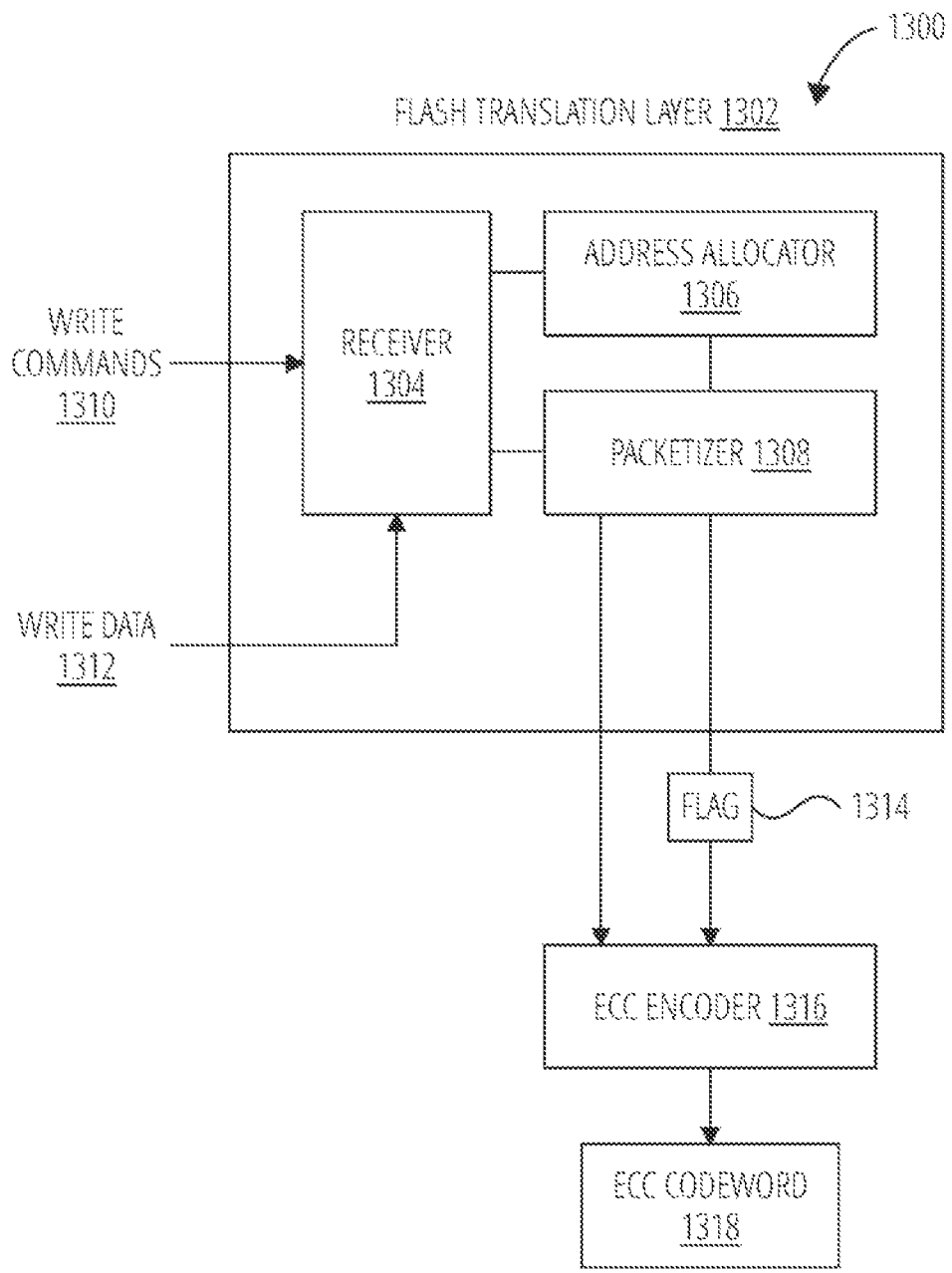
FIG. 13 illustrates an apparatus 1300 in accordance with one embodiment.

FIG. 13 illustrates an apparatus 1300 in accordance with one embodiment. In one embodiment, the apparatus 1300 comprises a flash translation layer 1302. The flash translation layer 1302 may comprise a receiver 1304, an address allocator 1306, and a packetizer 1308. "Flash translation layer" refers to logic in a non-volatile storage device, chip, or component, such as a storage class memory device or FLASH memory device, that includes logical-to-physical address translation providing abstraction of the logical block addresses used by a storage client (e.g. a host) and the physical block addresses at which a storage controller stores data. The logical-to-physical translation layer maps logical block addresses (LBAs) to physical addresses of data stored on solid-state storage media. This mapping allows data to be referenced in a logical block address space using logical identifiers, such as a block address. A logical identifier does not indicate the physical location of data on the solid-state storage media but is an abstract reference to the data.

The receiver 1304 may receive write commands 1310 and write data 1312. "Write data" refers to data from a host that is intended to be written to a non-volatile storage media. The write commands 1310 may comprise a type of storage command to write data to the non-volatile storage media. In certain embodiments, the write commands 1310 may be separate from the write data 1312. The write data 1312 may be transmitted from a host 102 to a storage controller 104 by a direct memory access (DMA) operation. "Receiver" refers to any hardware, software, firmware, circuit, component, module, logic, device, or apparatus configured, programmed, designed, arranged, or engineered to receive one or more write commands.

The receiver 1304 may coordinate with the address allocator 1306 to determine where the write data 1312 will be stored. The address allocator 1306 may determine a multi-level page to store a set of data blocks associated with a set of write commands 1310. "Address allocator" refers to any circuit, sub-circuit, electronic component, hardware, software, firmware, module, logic, device, or apparatus configured, programmed, designed, arranged, or engineered to determine, assign and/or allocate a physical block address for a particular logical block address.

The packetizer 1308 may coordinate with the receiver 1304 and address allocator 1306 to prepare the write data 1312 for storage on the non-volatile storage media. "Packetizer" refers to any hardware, software, firmware, circuit, component, module, logic, device, or apparatus configured, programmed, designed, arranged, or engineered to organize a set of source data into one or more data packets. In one embodiment, the source data may comprise user data for one or more storage operations. The packetizer may be configured to include a header, footer and/or redundancy data in each data packet. The packetizer may be configured to include padding data or filler data to combine with a remainder of the source data that does not completely fill a data packet.

The packetizer 1308 may combine the write data 1312 for the set of data blocks into a payload for an ECC codeword. The packetizer 1308 may coordinate with the address allocator 1306 to determine which multi-level page a particular ECC codeword is assigned to be stored on. Based on a determined multi-level page for the particular ECC codeword, the packetizer 1308 may change a payload size for the payload of the particular ECC codeword in response to a reliability attribute of the determined multi-level page satisfying a threshold.

In one embodiment, the packetizer 1308 may increase the payload size in response to the reliability attribute identifying the multi-level page as having higher data integrity than another multi-level page configured to be stored on a physical page that is also configured to store the multi-level page.

In one embodiment, the threshold may comprise a minimum threshold and the packetizer 1308 may not change the payload size unless the reliability attribute meets, or exceeds, the minimum threshold. In another embodiment, the packetizer 1308 may check a reliability attribute against a maximum threshold and if the reliability attribute meets, or exceeds, the maximum threshold the packetizer 1308 may change the payload size, for example decreasing the payload size and increasing the parity size such that the particular ECC codeword has increased ECC strength.

The packetizer 1308 may send data packets that include the payload (which may have been changed in size) to an error correction code encoder 1316. The packetizer 1308 may also signal a changed payload size to the error correction code encoder 1316. The packetizer 1308 may set a flag 1314 to signal the changed payload size to the error correction code encoder 1316. "Flag" refers to an indicator, signal, variable, or parameter configured to identify a certain state, condition, situation, or circumstance. The error correction code encoder 1316 is configured to generate ECC codewords 1318 that may include variable size payloads.

In one embodiment, the ECC codeword 1318 may comprise the payload and a parity section, and the error correction code encoder may proportionally change the parity section size in response to the packetizer 1308 changing the payload size such that the ECC codeword 1318 remains the same size as ECC codewords for which the packetizer 1308 does not change the payload size.

In one embodiment, each data block may comprise a set of data sectors, and the packetizer 1308 may change the payload size by adding or removing data sectors to a default payload size. The error correction code encoder 1316 may proportionally change the parity size by adding or removing redundancy data sized to have the same size as the added, or removed, data sectors. Payload and parity sections may include padding before, or after, the data and redundancy data sectors, respectively.

Figure 14:
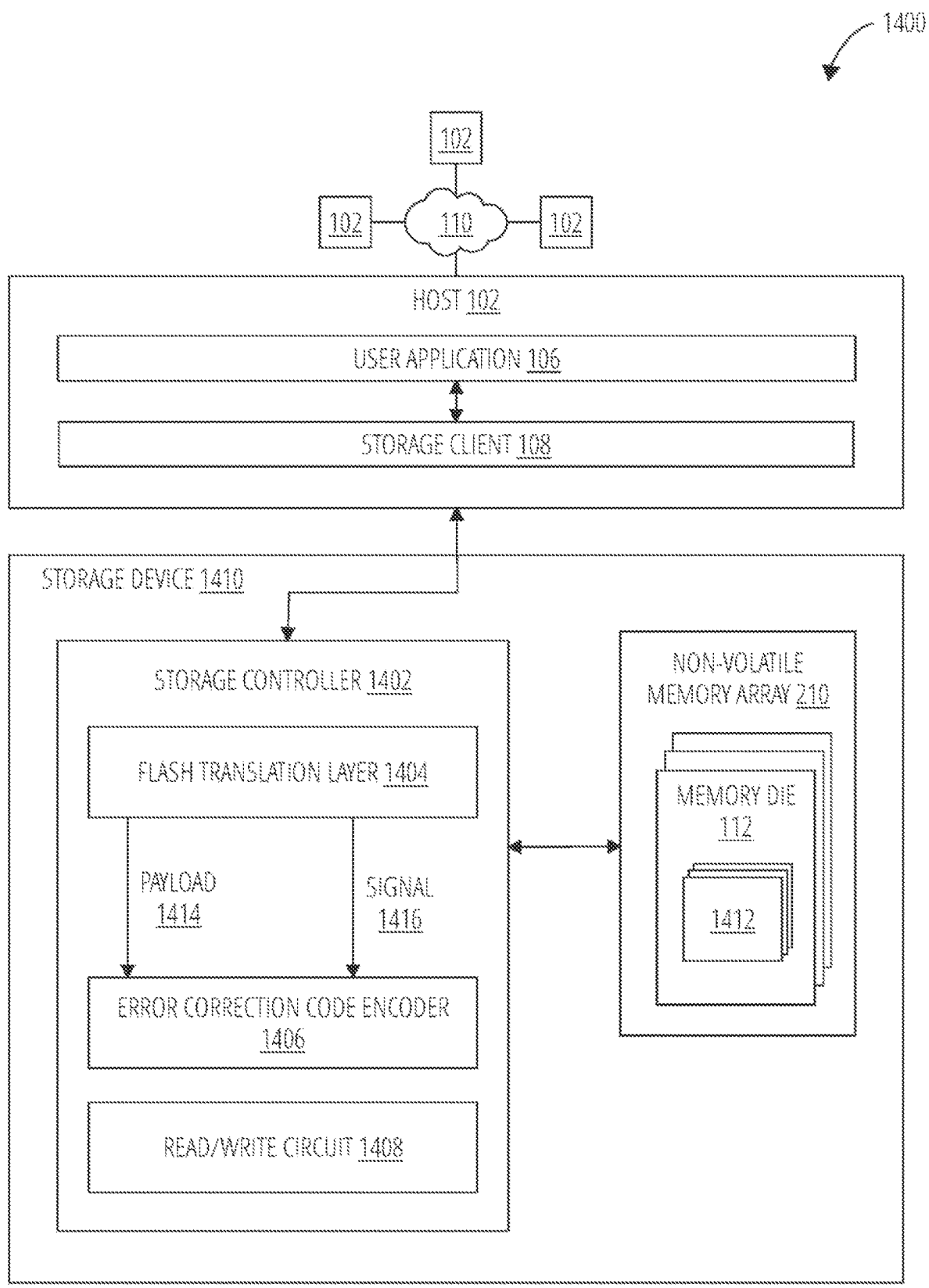
FIG. 14 is a block diagram of an example storage system 1400 in accordance with one embodiment.

FIG. 14 is a schematic block diagram of a storage system 1400 in accordance with one embodiment. The storage system 1400 may include a storage device 1410 that comprises a storage controller 1402 and non-volatile memory array 210. The non-volatile memory array 210 may comprise memory die 112 containing multi-level pages 1412 implemented using Quad-level Cell (QLC) memory cells.

The storage controller 1402 may further comprise a flash translation layer 1404, an error correction code encoder 1406, and a read/write circuit 1408. Those of skill in the art will appreciate that these components may be incorporated within other parts of the storage device 1410 or may be carried out by the host 102 in certain embodiments.

The flash translation layer 1404 may convert a logical block address (LBA) of a storage command into a physical block address (PBA) assigned to a multi-level page of QLC memory cells within the multi-level pages 1412 of the non-volatile memory array 210. The flash translation layer 1404 may associate write data of a plurality of write commands with the multi-level page, the multi-level page having a type selected from the group consisting of a lower multi-level page, a middle multi-level page, an upper multi-level page, and a top multi-level page. In one embodiment, the flash translation layer 1404 may send a signal 1416 to the error correction code encoder 1406, along with the payload 1414 containing write data associated with a plurality of write commands. The signal 1416 may indicate to the error correction code encoder 1406 that certain ECC codewords are to have a different ECC strength than other ECC codewords.

The error correction code encoder 1406 may generate ECC codewords for the write data/payload 1414 assigned to the multi-level page and sent from the flash translation layer 1404. The error correction code encoder 1406 may adjust an ECC strength for the generated ECC codewords in response to the multi-level page comprising at least one multi-level page type. In some embodiments, for example, the top multi-level page and lower multi-level page may have different ECC strength ECC codewords, while the middle multi-level page and upper multi-level page may have no change to the ECC strength of the ECC codewords stored on those multi-level pages.

The read/write circuit 1408 may store, write, or record, the ECC codewords on the multi-level pages of the memory die 112 of the non-volatile memory array 210 in response to write commands. The read/write circuit 1408 is configured to service storage operations to provide storage services to one or more storage clients 108. The read/write circuit 1408 may be configured to write data to memory cells of the plurality of memory dies 112. The read/write circuit 1408 coordinates with the error correction code encoder 1406 and flash translation layer 1404 to service write commands and read commands. The read/write circuit 1408 reads data from multi-level pages 1412 of the non-volatile memory array 210.

The read/write circuit 1408 may coordinate with the error correction code encoder 1406 to determine a bit error rate, or an estimated or proxy bit error rate, for each read of a multi-level pages 1412. In one embodiment, the error correction code encoder 1406 determines the bit error rate without doing any error correction or detection. In one embodiment, the determined the bit error rate may be used as an attribute, such as a reliability attribute, for the multi-level page having that bit error rate.

In one embodiment, the lower multi-level page may include a single memory state transition based on the multi-level storage cell encoding used to encode the multi-level page.

The error correction code encoder 1406 may decrease the ECC strength in response to the multi-level page being of the lower multi-level page type. This may be indicated by an attribute as described with regard to FIG. 11.

The read/write circuit 1408 may read an ECC codeword (having a lower ECC strength or a higher ECC strength) from the multi-level page based on the PBA assigned to an LBA of a read command. The PBA may be determined using an address mapping table that maps LBAs to PBAs. The read/write circuit 1408 may signal to the error correction code encoder 1406 that the read ECC codeword has an adjusted ECC strength in response to the type of multi-level page associated with the ECC codeword. In one embodiment, the signal 1416 is sent using a flag 1314. The read/write circuit 1408 may determine the type of multi-level page based on its knowing which multi-level page the read/write circuit 1408 has just read.

While ECC codewords read from the lower multi-level page have lower ECC strength, these ECC codewords also have higher data integrity, consequently the ECC codewords have fewer bits in error and therefore do not need a higher ECC strength. Furthermore, because the ECC codeword remains the same size and ECC strength is reduced by reducing the amount of redundancy data, more data sectors may be included in ECC codewords on the lower multi level page.

The read/write circuit 1408 may read an ECC codeword (having a lower ECC strength) from the multi-level page based on a PBA assigned to an LBA of a read command. The multi-level page, in one embodiment, may store four ECC codewords, each sized to hold 4 KB of data. The error correction code encoder may change the ECC strength by varying a ratio of user data (e.g., data stored in the payload) relative to redundancy data in the generated ECC codeword.

Figure 15:
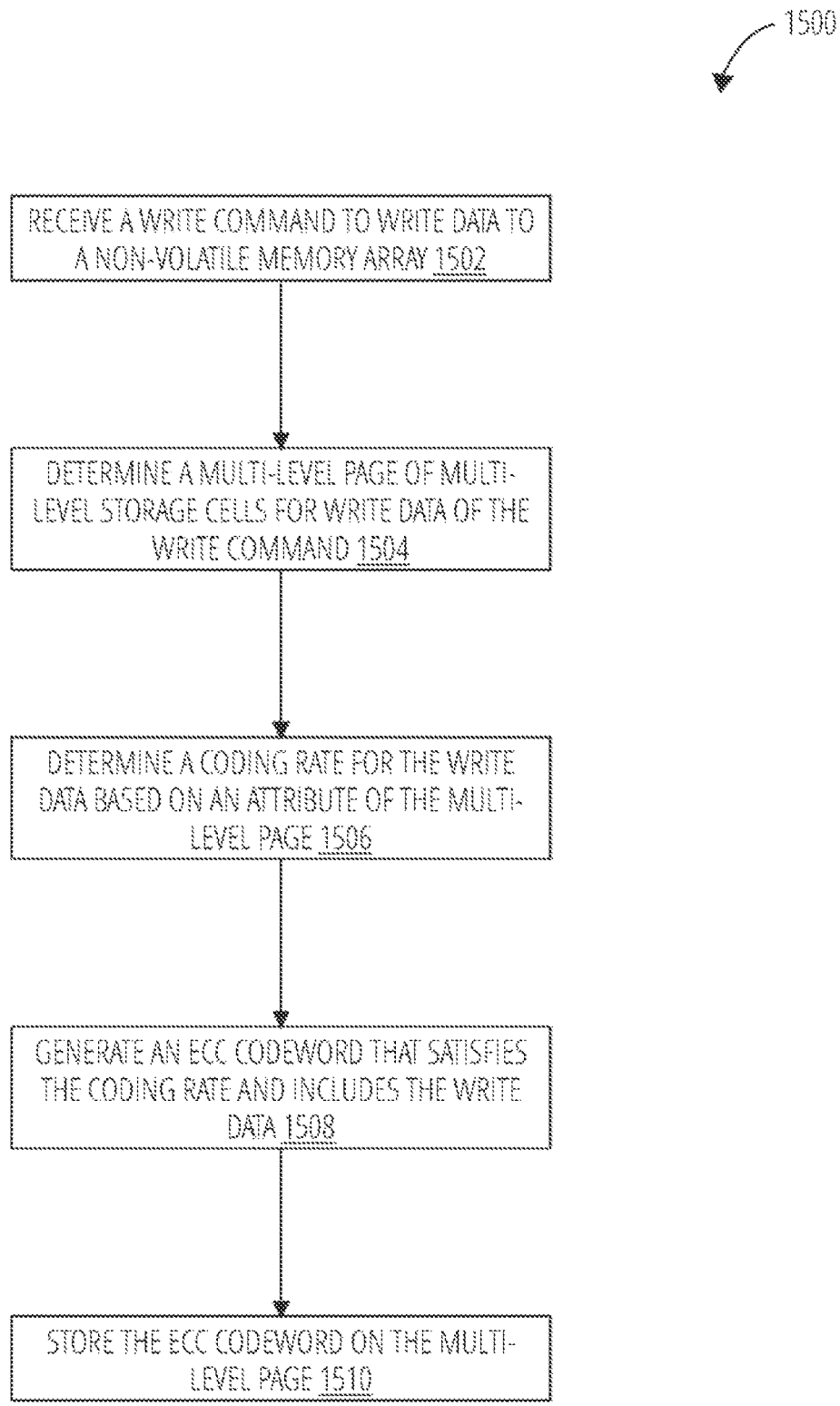
FIG. 15 illustrates a routine 1500 in accordance with one embodiment.

FIG. 15 illustrates a routine 1500 for level dependent error correction code protection in multi-level non-volatile memory. First, at block 1502, a write command to write data to a non-volatile memory array may be received. The non-volatile memory array may maintain multi-level pages stored on word lines of multi-level storage cells as introduced in FIG. 5. The physical page of the word line may be configured to store data on a plurality of multi-level pages, such as a lower multi-level page, a middle multi-level page, an upper multi-level page, and a top multi-level page.

In block 1504, a multi-level page of multi-level storage cells may be determined for the write data of the write command. In block 1506, a coding rate may be determined for the write data based on an attribute of the multi-level page, as introduced in FIG. 11 and FIG. 12. Depending on the attribute for certain multi-level pages, certain multi-level pages may receive write data error correction code encoded using a different coding rate. The coding rate may differ from a default coding rate.

In block 1508, an ECC codeword may be generated that satisfies the coding rate and includes the write data. At block 1510, the ECC codeword may be stored on the multi-level page. The routine 1500 may be performed using the apparatus 1300 and/or the storage system 1400 introduced in FIG. 14.

Figure 16:
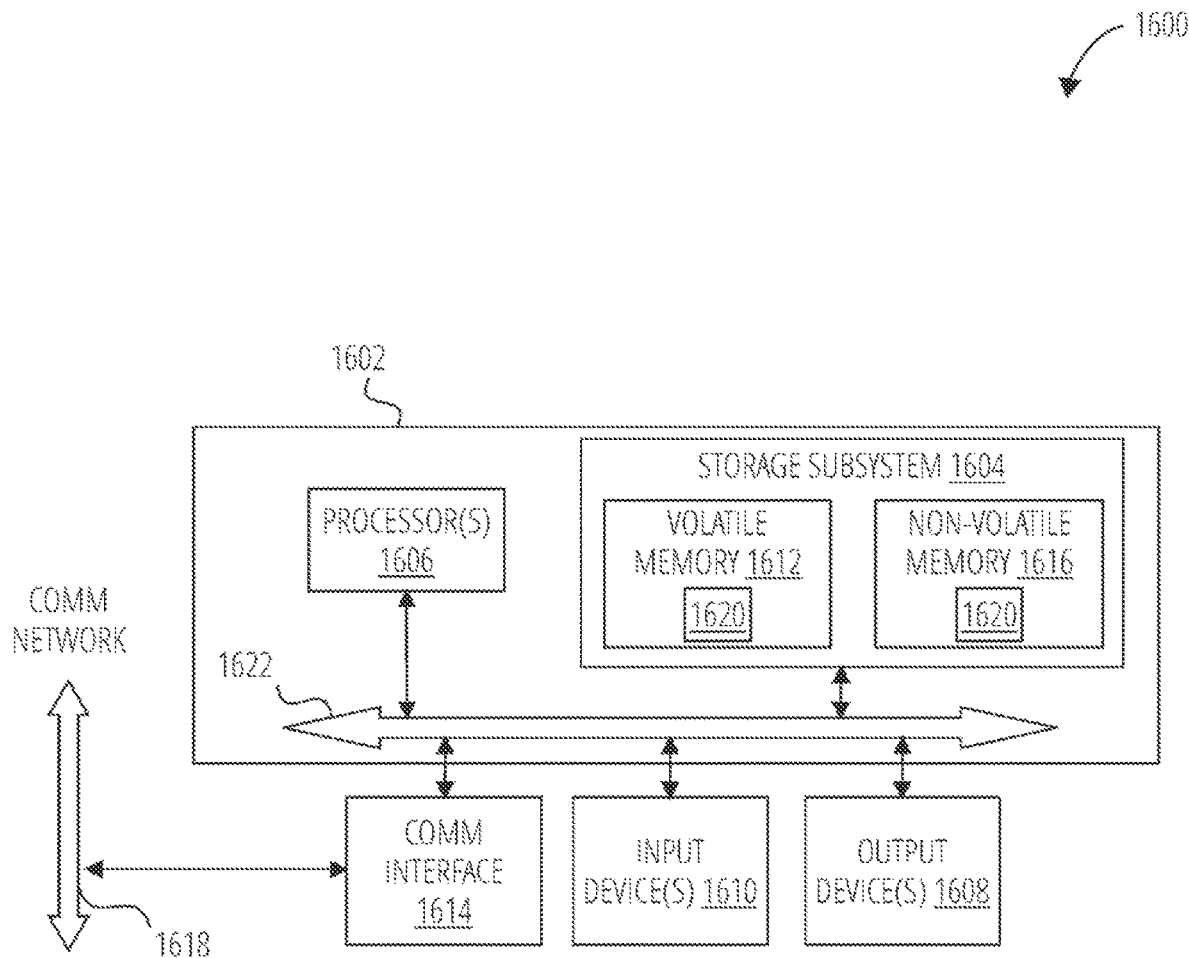
FIG. 16 is an example block diagram of a computing device 1600 that may incorporate certain embodiments.

FIG. 16 is an example block diagram of a computing device 1600 that may incorporate embodiments of the solution. FIG. 16 is merely illustrative of a machine system to carry out aspects of the technical processes described herein and does not limit the scope of the claims. One of ordinary skill in the art would recognize other variations, modifications, and alternatives. In certain embodiments, the computing device 1600 includes a data processing system 1602, a communication network 1618, communication network interface 1614, input device(s) 1610, output device(s) 1608, and the like.

As depicted in FIG. 16, the data processing system 1602 may include one or more processor(s) 1606 and a storage subsystem 1604. "Processor" refers to any circuitry, component, chip, die, package, or module configured to receive, interpret, decode, and execute machine instructions. "Instructions" refers to symbols representing commands for execution by a device using a processor, microprocessor, controller, interpreter, or other programmable logic. Broadly, 'instructions' can mean source code, object code, and executable code. "Instructions" herein is also meant to include commands embodied in programmable read-only memories (EPROM) or hard coded into hardware (e.g., "micro-code") and like implementations wherein the instructions are configured into a machine read-only memory or other hardware component at manufacturing time of a device. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1606 communicate with a number of peripheral devices via a bus subsystem 1622. These peripheral devices may include input device(s) 1610, output device(s) 1608, communication network interface 1614, and the storage subsystem 1604. The storage subsystem 1604, in one embodiment, comprises one or more storage devices and/or one or more memory devices.

"Storage device" or "memory device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

In one embodiment, the storage subsystem 1604 includes a volatile memory 1612 and a non-volatile memory 1616. The volatile memory 1612 and/or the non-volatile memory 1616 may store computer-executable instructions that alone or together form logic 1620 that when applied to, and executed by, the processor(s) 1606 implement embodiments of the processes disclosed herein.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory.

While the volatile memory media is referred to herein as "memory media," in various embodiments, the volatile memory media may more generally be referred to as volatile memory.

"Non-volatile memory" refers to a shorthand name for non-volatile memory media. In certain embodiments, non-volatile memory media refers to the non-volatile memory media and the logic, controllers, processor(s), state machine (s), and/or other periphery circuits that manage the non-volatile memory media and provide access to the non-volatile memory media.

The input device(s) 1610 include devices and mechanisms for inputting information to the data processing system 1602. These may include a keyboard, a keypad, a touch screen incorporated into a graphical user interface, audio input devices such as voice recognition systems, microphones, and other types of input devices. In various embodiments, the input device(s) 1610 may be embodied as a computer mouse, a trackball, a track pad, a joystick, wireless remote, drawing tablet, voice command system, eye tracking system, and the like. The input device(s) 1610 typically allow a user to select objects, icons, control areas, text and the like that appear on a graphical user interface via a command such as a click of a button or the like.

The output device(s) 1608 include devices and mechanisms for outputting information from the data processing system 1602. These may include a graphical user interface, speakers, printers, infrared LEDs, and so on, as well understood in the art. In certain embodiments, a graphical user interface is coupled to the bus subsystem 1622 directly by way of a wired connection. In other embodiments, the graphical user interface couples to the data processing system 1602 by way of the communication network interface 1614. For example, the graphical user interface may comprise a command line interface on a separate computing device 1600 such as desktop, server, or mobile device.

The communication network interface 1614 provides an interface to communication networks (e.g., communication network 1618) and devices external to the data processing system 1602. The communication network interface 1614 may serve as an interface for receiving data from and transmitting data to other systems. Embodiments of the communication network interface 1614 may include an Ethernet interface, a modem (telephone, satellite, cable, ISDN), (asynchronous) digital subscriber line (DSL), Fire-Wire, USB, a wireless communication interface such as Bluetooth or WiFi, a near field communication wireless interface, a cellular interface, and the like.

The communication network interface 1614 may be coupled to the communication network 1618 via an antenna, a cable, or the like. In some embodiments, the communication network interface 1614 may be physically integrated on a circuit board of the data processing system 1602, or in some cases may be implemented in software or firmware, such as "soft modems", or the like.

The computing device 1600 may include logic that enables communications over a network using protocols such as HTTP, TCP/IP, RTP/RTSP, IPX, UDP and the like.

The volatile memory 1612 and the non-volatile memory 1616 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 1612 and the non-volatile memory 1616 may be configured to store the basic programming and data constructs that provide the functionality of the disclosed processes and other embodiments thereof that fall within the scope of the present disclosure.

Logic 1620 that implements one or more parts of embodiments of the solution may be stored in the volatile memory 1612 and/or the non-volatile memory 1616. Logic 1620 may be read from the volatile memory 1612 and/or non-volatile memory 1616 and executed by the processor(s) 1606. The volatile memory 1612 and the non-volatile memory 1616 may also provide a repository for storing data used by the logic 1620. "Repository" refers to any data source or dataset that includes data, or content. In one embodiment, a repository resides on a computing device. In another embodiment, a repository resides on a remote computing or remote storage device. A repository may comprise a file, a folder, a directory, a set of files, a set of folders, a set of directories, a database, an application, a software application, content of a text, content of an email, content of a calendar entry, and the like. A repository, in one embodiment, comprises unstructured data. A repository, in one embodiment, comprises structured data such as a table, an array, a queue, a look up table, a hash table, a heap, a stack, or the like. A repository may store data in any format including binary, text, encrypted, unencrypted, a proprietary format, or the like.

The volatile memory 1612 and the non-volatile memory 1616 may include a number of memories including a main random access memory (RAM) for storage of instructions and data during program execution and a read only memory (ROM) in which read-only non-transitory instructions are stored. The volatile memory 1612 and the non-volatile memory 1616 may include a file storage subsystem providing persistent (non-volatile) storage for program and data files. The volatile memory 1612 and the non-volatile memory 1616 may include removable storage systems, such as removable FLASH memory.

The bus subsystem 1622 provides a mechanism for enabling the various components and subsystems of data processing system 1602 communicate with each other as intended.

Although the communication network interface 1614 is depicted schematically as a single bus, some embodiments of the bus subsystem 1622 may utilize multiple distinct busses.

It will be readily apparent to one of ordinary skill in the art that the computing device 1600 may be a device such as a smartphone, a desktop computer, a laptop computer, a rack-mounted computer system, a computer server, or a tablet computer device. As commonly known in the art, the computing device 1600 may be implemented as a collection of multiple networked computing devices. Further, the computing device 1600 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method, comprising:
   receiving a write command to write data to a non-volatile memory array;
   determining a multi-level page of multi-level storage cells for write data of the write command;
   determining a coding rate for write data of at least one multi-level page based on an attribute of the at least one multi-level page, wherein the attribute of the at least one multi-level page comprises a reliability attribute based on a relationship between data integrity among different multi-level pages on a same multi-level storage cell;
   generating an ECC codeword that satisfies the coding rate and includes the write data; and
   storing the ECC codeword on the at least one multi-level page.

2. The method of claim 1, wherein the attribute comprises a reliability attribute based on a multi-level storage cell encoding configured to define a plurality of multi-level pages within a page of the non-volatile memory array such that two or more of the plurality of multi-level pages have different reliability attributes.

3. The method of claim 2, wherein the multi-level storage cell encoding defines one memory state transition for a lower multi-level page, two memory state transitions for a middle multi-level page, six memory state transitions for an upper multi-level page, and six memory state transitions for a top multi-level page.

4. The method of claim 2, wherein the multi-level storage cell encoding defines one memory state transition for a lower multi-level page, two memory state transitions for a middle multi-level page, four memory state transitions for an upper multi-level page, and eight memory state transitions for a top multi-level page.

5. The method of claim 2, wherein the multi-level storage cell encoding defines two memory state transitions for a lower multi-level page, three memory state transitions for a middle multi-level page, five memory state transitions for an upper multi-level page, and five memory state transitions for a top multi-level page.

6. The method of claim 1, wherein the attribute comprises a bit error rate for the at least one multi-level page.

7. The method of claim 1, wherein the attribute comprises a type of multi-level page and the type comprises one of a lower multi-level page, a middle multi-level page, an upper multi-level page, and a top multi-level page.

8. The method of claim 1, wherein the attribute comprises a number of read levels defined for the at least one multi-level page by a multi-level storage cell encoding.

9. The method of claim 1, wherein the attribute comprises a reliability attribute and determining a coding rate for write data of the at least one multi-level page comprises increasing a coding rate for the at least one multi-level page in response to the at least one multi-level page having a greater reliability attribute than other multi-level pages.

10. The method of claim 1, wherein the ECC codeword comprises a payload and a parity section and wherein determining the coding rate further comprises:
   increasing a payload size of the payload in response to the attribute indicating greater data integrity for data stored on the at least one multi-level page relative to data stored on another multi-level page stored on the multi-level storage cells;
   decreasing a parity size of the parity section in response to, and by a same amount as, the increased payload size;
   decreasing the payload size of the payload in response to the attribute indicating less data integrity for data stored on the at least one multi-level page relative to data stored on another multi-level page stored on the multi-level storage cells;

increasing a parity size of the parity section in response to, and by the same amount as, the decreased payload size; and wherein the parity size changes in proportion to the payload size such that the ECC codeword maintains a same size.

11. The method of claim 1, wherein the non-volatile memory array comprises NAND memory cells and the multi-level storage cell encoding is configured to divide up a threshold voltage (Vt) window into a plurality of memory states and assign a binary encoding to each memory state, the binary encoding configured such that each bit in the binary encoding represents a binary value on each multi-level page of a plurality of multi-level pages and wherein the binary encoding is assigned according to a gray code encoding.

12. An apparatus, comprising:
an address allocator configured to determine a multi-level page to store a set of data blocks associated with a set of write commands; and
a packetizer configured to:
combine the set of data blocks into a payload for an ECC codeword;
change a payload size for the payload in response to a reliability attribute of the determined multi-level page satisfying a threshold, wherein the reliability attribute is based on a relationship between data integrity among different multi-level pages on a same multi-level storage cell; and
signal the changed payload size to an error correction code encoder configured to generate the ECC codeword.

13. The apparatus of claim 12, wherein the packetizer is configured to increase the payload size in response to the reliability attribute identifying the multi-level page as having higher data integrity than another multi-level page configured to be stored on a physical page that is also configured to store the multi-level page.

14. The apparatus of claim 12, wherein the ECC codeword comprises the payload and a parity section and the error correction code encoder is configured proportionally change the parity section in response to the packetizer changing the payload size such that the ECC codeword remains a same size as ECC codewords for which the packetizer does not change the payload size.

15. The apparatus of claim 12, wherein each data block comprises a set of data sectors and the packetizer is configured to change the payload size by adding or removing data sectors to a default payload size and the error correction code encoder is configured to proportionally change a parity size by adding or removing redundancy data sized to have the same size as the added or removed data sectors.

16. The apparatus of claim 12, wherein the packetizer is configured to set a flag to signal the changed payload size to the error correction code encoder.

17. A system, comprising:
a non-volatile memory array comprising Quad-level Cell (QLC) memory cells; and
a storage controller comprising:
a flash translation layer configured to:
convert a logical block address (LBA) of a storage command into a physical block address (PBA) assigned to a multi-level page of QLC memory cells; and
associate write data of a plurality of write commands with the multi-level page, the multi-level page having a type selected from the group consisting of a lower multi-level page, a middle multi-level page, an upper multi-level page, and a top multi-level page;
an error correction code encoder configured to:
generate ECC codewords for the write data assigned to the multi-level page;
adjust an ECC strength for the generated ECC codewords in response to the multi-level page comprising at least one type, wherein the at least one type of the multi-level page provides a relationship between data integrity among different multi-level pages on a same multi-level storage cell; and
a read/write circuit configured to store the ECC codewords on the multi-level page in response to write commands.

18. The system of claim 17, wherein the lower multi-level page is configured to include a single memory state transition based on a multi-level storage cell encoding used to encode the multi-level page and the error correction code encoder is configured to decrease the ECC strength in response to the multi-level page having the type of the lower multi-level page.

19. The system of claim 17, wherein the read/write circuit is configured to:
read an ECC codeword from the multi-level page based on the PBA assigned to an LBA of a read command; and
signal to the error correction code encoder that the read ECC codeword has an adjusted ECC strength in response to the type of multi-level page associated with the ECC codeword.

20. The system of claim 17, wherein the multi-level page is configured to store four ECC codewords each sized to hold 4 KB of data and the error correction code encoder is configured to change the ECC strength by varying a ratio of user data relative to redundancy data in the generated ECC codeword.

* * * * *